(12) United States Patent
Bruwer et al.

(10) Patent No.: US 12,007,418 B2
(45) Date of Patent: Jun. 11, 2024

(54) ADVANCED CHARGE TRANSFER MEASUREMENT TECHNIQUES

(71) Applicant: AZOTEQ HOLDINGS LIMITED, Nicosia (CY)

(72) Inventors: Frederick Johannes Bruwer, Paarl (CA); Daniel Barend Rademeyer, Paarl (CA); Nico Johann Swanepoel, Paarl (CA)

(73) Assignee: AZOTEQ HOLDINGS LIMITED, Nicosia (CY)

( * ) Notice: Subject to any disclaimer, the term of this patent is extended or adjusted under 35 U.S.C. 154(b) by 166 days.

(21) Appl. No.: 17/855,295

(22) Filed: Jun. 30, 2022

(65) Prior Publication Data
US 2023/0003775 A1 Jan. 5, 2023

(30) Foreign Application Priority Data
Aug. 25, 2021 (ZA) ................................. 2021/06115

(51) Int. Cl.
*G01R 19/165* (2006.01)
(52) U.S. Cl.
CPC .... *G01R 19/16576* (2013.01); *H02J 2207/50* (2020.01)
(58) Field of Classification Search
CPC .......................... G01R 31/34; G01R 19/16576
See application file for complete search history.

(56) References Cited

U.S. PATENT DOCUMENTS

| | | |
|---|---|---|
| 5,730,165 A | 3/1998 | Philipp |
| 6,452,514 B1 | 9/2002 | Philipp |
| 6,466,036 B1 | 10/2002 | Philipp |
| 6,888,536 B2 | 5/2005 | Westerman et al. |
| 7,262,609 B2 | 8/2007 | Reynolds |
| 7,288,946 B2 * | 10/2007 | Hargreaves ........ G01R 27/2605 324/678 |
| 7,830,158 B2 | 11/2010 | Geaghan |
| 7,863,909 B2 | 1/2011 | Keith |
| 8,395,395 B2 | 3/2013 | Bruwer et al. |
| 8,531,193 B2 | 9/2013 | Valisuo et al. |
| 8,659,306 B2 | 2/2014 | Bruwer et al. |
| 8,847,802 B2 | 9/2014 | Lundstrum et al. |
| 8,847,811 B2 | 9/2014 | Wong et al. |
| 8,896,327 B2 | 11/2014 | Brunet et al. |
| 9,071,264 B2 | 6/2015 | Lundstrum et al. |
| 9,116,188 B2 | 8/2015 | Kuang |

(Continued)

FOREIGN PATENT DOCUMENTS

EP 2 617 132 B1 12/2020

*Primary Examiner* — Tung X Nguyen
(74) *Attorney, Agent, or Firm* — MATTINGLY & MALUR, PC

(57) ABSTRACT

The present invention is directed at improving charge transfer based measurement techniques. This may be done through the use of a sigma-delta like sensing circuit that continually removes a specific amount of charge from an accumulator to produce a binary bit output stream reflective of the state of a connected sensor. Further techniques include detection of a charge transfer measurement residual through a controlled, multi-step charge removal until a trip event is cleared, as well as the reuse of a voltage threshold with a plurality of charge transfers measurements of different resolution.

20 Claims, 5 Drawing Sheets

(56) References Cited

U.S. PATENT DOCUMENTS

| | | | |
|---|---|---|---|
| 9,304,156 B2 | 4/2016 | Weingaertner et al. | |
| 9,383,395 B1 | 7/2016 | Ogirko et al. | |
| 9,389,252 B2 | 7/2016 | Nys et al. | |
| 9,529,030 B2 | 12/2016 | Ogirko et al. | |
| 9,703,436 B2 | 7/2017 | Hargreaves | |
| 9,709,614 B2 | 7/2017 | Bruwer et al. | |
| 10,101,862 B2 | 10/2018 | Borgmann et al. | |
| 10,527,457 B2 | 1/2020 | Bruwer et al. | |
| 10,819,359 B2 | 10/2020 | Omran et al. | |
| 11,294,504 B2 | 4/2022 | Guedon et al. | |
| 2013/0191060 A1* | 7/2013 | Grosjean | G01P 15/125 |
| | | | 702/65 |
| 2015/0249457 A1* | 9/2015 | Miyake | H02M 1/12 |
| | | | 341/158 |
| 2016/0370411 A1 | 12/2016 | Bruwer et al. | |
| 2021/0226626 A1 | 7/2021 | Ogirko | |

\* cited by examiner

ADVANCED CHARGE TRANSFER MEASUREMENT TECHNIQUES

CROSS-REFERENCE TO RELATED APPLICATION

The present application claims priority from South Africa applications ZA 2021/04580, filed on Jul. 1, 2021, and ZA 2021/06115, filed Aug. 25, 2021, contents of which is hereby incorporated by reference into this application.

BACKGROUND OF THE INVENTION

Transferring charge from a sensor to a storage element while monitoring any number of parameters associated with the transfer, and using said parameters to determine characteristics of the sensor is known in the electronic measurement arts. For example, refer to U.S. Pat. Nos. 5,730,165, 6,452,514 and 6,466,036 by Philipp, which teach charge transfer techniques and circuits for capacitive sensing.

In addition, methods and techniques to compensate for parasitic elements and for improving measurement sensitivity through the use of current mirrors are also known, with reference to U.S. Pat. Nos. 8,395,395 and 8,659,306, sharing inventors with the current application.

Charge transfer measurement techniques can also be used for more than capacitive sensing, with a range or parameters which may possibly be sensed with the same or a similar charge transfer engine. Refer to U.S. Pat. Nos. 9,709,614, 10,527,457 and 2016/0370411, sharing inventors with the current application.

Charge transfer measurement techniques are not exempt from the continual need to measure faster, or for less cost, or using less power or at a higher resolution. The following discloses charge transfer measurement improvements in the form of methods and apparatus which may satisfy this need.

SUMMARY OF THE INVENTION

In an effort to clarify the disclosure of the present invention, the following summary is presented. This should not be construed as limiting to the claims of the invention, with more embodiments potentially existing than what is described in the following and which fall within the spirit and scope of the invention.

In a first instance, the present invention teaches a charge transfer process wherein the decision to halt the transfer of units of charge from a sensor, or a sensor circuit, to a storage element, for example an accumulation capacitor, may be based on a majority-rules criterium. For example, during or after each charge transfer cycle a plurality of measurements of a specific parameter may be made, and compared with a reference value. If the parameter exceeds the reference for a majority of said plurality, the decision may be made to halt the charge transfer process, with the number of charge transfer cycles, the value of said parameter or another parameter which may be used as the charge transfer process result.

As a further, more detailed example, consider a charge transfer measurement used for capacitive sensing, where a long-term average of the number of charge transfer cycles, or counts as they are known, is approximately a thousand. In other words, the measurement halted on average after transferring a unit of charge from a capacitive sensor to a storage capacitor a thousand times. Thus, on average the voltage on the storage capacitor exceeds a reference voltage after a thousand transfers. According to the present invention, a plurality of measurements of the voltage on said storage capacitor, or of another parameter or on another storage element, may be made during or after each charge transfer cycle, for example five measurements. That is, five measurements may be made during or after each of the e.g., thousand, charge transfer cycles. Before an entity, for example a circuit, or software, or a combination of circuitry and software, such as a processor, reaches the decision to halt said charge transfer process, three of said five measurements i.e., a majority, of the last charge transfer cycle may need to satisfy a specific requirement e.g., three of the five measurements may need to be above a reference voltage.

A processor, or another circuit or entity, may make use of a simple counter to implement the above majority-rules requirement, wherein the counter may, e.g., increment every time the storage capacitor is measured to be above a reference voltage. Once said counter reaches a number equal to a predetermined majority value, the decision may be made to halt said charge transfer process.

In addition, the present invention teaches that said plurality of measurements may be performed without negatively affecting the amount of time required for the complete charge transfer measurement process. For example, the plurality of measurements may be performed during a period when a sensor electrode is charged to a specific voltage, and not during the period when charge is transferred from said electrode to a storage element.

It is to be appreciated that the above is not limited to capacitive sensing applications, or the use of a storage capacitor, but may be applied to any relevant charge transfer, or other, measurement method or apparatus for example the ADC measurement of the transferred charge as used in some implementation, may be repeated multiple times in order to get a more accurate value. Or a majority-rules algorithm may be used, for example, to improve a capacitive sensing application that utilizes a measurement technique other than charge transfer.

The present invention further teaches methods and apparatus which may be used to improve the resolution of charge transfer, or other, measurements. In an exemplary embodiment, a charge transfer process may be used to transfer charge towards a storage element, for example a storage capacitor. After a number of charge transfers, or counts, the voltage across said storage element (Cs) may equal or exceed a predetermined first reference voltage (Vtrip), and the transfer process may be halted. Due to the fact that each charge transfer uses a specific amount or packet of charge, the voltage on said storage element after halting may exceed the reference voltage by a residual amount. In other words, due to the packet size or sizes used for charge transfer, the last packet of charge before halting may increase the voltage of said storage element by more than what is required to reach the reference voltage, leading to the storage element having a voltage equal to said reference value plus a residual voltage. This is in effect quantization noise or errors.

According to the present invention, said residual voltage may be additionally measured and used with the number of counts up to said halting, or another parameter associated with the charge transfer process up to said halting, to obtain a higher resolution measurement result than what would be obtained from using just the number of charge transfers or counts or said another parameter. For example, an analog-to-digital converter (ADC) may be used to measure said residual voltage. This may significantly increase the resolution of the process used to determine or measure a specific sensor parameter or a change in the sensor parameter. In essence, by measuring the residual voltage with a n-bit ADC, said resolution is increased by n-bits as well. For example, if the charge-transfer process has a nominal resolution of $2^7$ or 128 discrete levels, using a 3-bit ADC to additionally measure said residual voltage may increase the overall resolution to $2^{10}$ or 1024 discrete levels, as will be further elaborated on during the detailed description of the current application. It is contemplated that any relevant form of ADC may be used in the above, for example sigma-delta ADC's, resistive ladder network ADC's and so forth. Further, the present invention teaches that a sigma-delta type ADC may be used in conjunction with charge transfer measurements throughout the complete measurement process to determine an overall measurement result. For example, a charge transfer measurement process may be used wherein charge may be repetitively transferred from a sensor, for example a capacitive sensor, towards the one or other storage element, for example towards an accumulation capacitor Cs. Once a sufficient number of transfers have been performed, the voltage of Cs may traverse or exceed a predetermined threshold which may cause a trip event. The present invention teaches that said trip may be used to signify a binary value of one in a stream of binary values representing said overall measurement result. Subsequently, a specific amount of charge may be removed from the Cs to cause said trip to clear. This may result in a binary value of zero in said stream of values. Charge transfers from the sensor may then resume, with the binary value of zero in said stream maintained until another trip event occurs, which may cause another binary value of one in the stream representing said result. Subsequently, said specific amount of charge may again be removed from Cs, causing the trip to clear and a resulting zero in the binary stream, followed by further charge transfers until the next trip event, and so on. In this exemplary manner, a sigma-delta type of ADC may be implemented to produce a binary bit stream as output, wherein the rate of occurrence of ones in the stream may be used to indicate a sensor parameter or a change in a sensor parameter. For example, if a sensor capacitance changes to a larger value, one values should occur more frequently in said bit stream, as the Cs may be filled faster after each trip-clearing event. The bit stream may be processed in any relevant manner to derive a further result. For example, an average value may be taken and so forth. The present invention further teaches that it may be important to properly clear said trip events by removing a sufficient amount of charge from Cs to avoid a situation where the voltage of Cs does not fall below said threshold after clearing.

In the directly preceding, it is to be appreciated that the invention is not limited in terms of the sensor type, but may be practised with any relevant sensor, for example inductive sensors, magnetic field sensors, specifically Hall-effect sensors, optical sensors, temperature sensors and so forth. Further, the amount of charge removed after each trip event may be statically or dynamically adjustable, based on the one or other parameter, and may make use of PCC and/or current mirror circuits.

The present invention should not be limited to charge transfer embodiments, and may be practised with any measurement apparatus or method which produces a residual voltage or a fractional part of a result and wherein said residual voltage or fractional part of a result is traditionally discarded. According to the present invention this residual voltage or fractional part of a result may be measured with an additional and/or alternative measurement step or steps, or process, method or apparatus, thereby increasing measurement resolution. For example, the present invention may be practised during capacitive sensing measurements that utilize techniques other than charge transfer to determine capacitance values, such as relaxation-oscillator techniques, capacitive-voltage division techniques, resonance-frequency techniques, and pulse-delay techniques, to name but a few. The present invention may also be practised by measurements other than capacitive sensing, for example it may be practised during inductive, optical, magnetic-field, temperature, resistance, voltage, or frequency measurements, or any of the myriad of sensing types and electronic measurements known in the art.

An exemplary and alternative manner for determination of said residual voltage may utilize a second charge transfer measurement process subsequent to halting a first charge transfer process when a voltage of Cs ($V_{CS}$) equals or exceeds said first reference mentioned in the preceding. The second charge transfer process may use smaller, or substantially smaller, packets of charge of a known value and a second reference voltage. For example, after said halting, the second charge transfer process may transfer a plurality of the smaller packets of charge to Cs until $V_{CS}$ equals or exceeds the second reference voltage. A circuit, software or a combination of a circuit and software may then determine any possible first residual voltage by which $V_{CS}$ exceeded said first reference voltage, since the first reference voltage may be known, the second reference voltage may be known, the number of charge transfers of said second charge transfer measurement process may be known, the value of charge packets used during said second charge transfer measurement process may be known and the value of Cs may be known. Equation (1) below describes a relationship between these parameters, and may potentially be used during determination of said residual voltage.

$$V_{res1} = (V_{Th2} - V_{Th1}) - ((n*Q_n)/Cs) \tag{1}$$

Wherein $V_{res1}$ is said residual voltage, $V_{Th2}$ is said second reference or threshold voltage, $V_{Th1}$ is said first reference or threshold voltage, n is the number of charge transfers during said second charge transfer process, $Q_n$ is the size of said smaller charge packets used by the second charge transfer process and Cs is the value of the accumulation capacitor.

Said second charge transfer process may result in another, second residual voltage by which $V_{CS}$ may exceed the second reference or threshold voltage. According to the present invention, this second residual voltage may be determined by a third charge transfer process akin to the second charge transfer process, but with still smaller or substantially smaller packets of charge of a known value used. In this manner, a charge transfer measurement process may be continually refined, with the potential goal of accurately determining said first residual voltage, and thereby increasing measurement resolution for the event which caused said first charge transfer process to halt. For example, when said event is a touch or proximity event which changes the capacitance of a measured capacitance Cm, the charge packet size used to transfer charge from Cm to Cs during the first charge transfer measurement process may be unknown, and hence may cause an unknown value for said first residual voltage. This may translate to an unknown value of said second residual voltage. The unknown value of said second residual voltage may introduce an error when (1) above is used to calculate the first residual. Determining the value of the second residual may allow use of (1.b) below to calculate the value of the first residual with increased accuracy.

$$V_{res1} = ((V_{Th2} + V_{res2}) - V_{Th1}) - ((n*Q_n)/Cs) \tag{1.b}$$

The directly preceding may be advantageous in that the additional charge transfer processes used for accurate determination of said first residual voltage may require less measurement time than what would be the case if a single charge transfer measurement process was conducted using only the smaller charge packets of said third charge transfer process for the whole measurement, as an example. In other words, the present invention teaches that a charge transfer measurement process may be split up into a number of sub-processes, with each sub-process using smaller, or substantially smaller, charge packets than the preceding sub-process.

In yet another exemplary, but related embodiment of the present invention, a plurality of consecutive charge transfer measurement processes with decreasing charge packet sizes may be used with a single voltage threshold to obtain a multi-digit counts value, wherein each digit represents a count value obtained with a particular charge packet size or quantum. For example, a first charge transfer measurement process, with a first size of charge packets transferred, may be performed until Cs reaches said single voltage threshold and a first trip event occurs. The counts value of the first charge transfer measurement process may be recorded. This may be followed by removal of an amount of charge from Cs equal or proportional to one, or more, of said first size of charge packets. In other words, charge equal or proportional to, or approximately equal or proportional to, one count of the first charge transfer measurement process may be removed from Cs subsequent to said first trip event. Alternatively, another predetermined amount of charge may be removed from Cs subsequent to said first trip event. Consequently, the first trip event should be cleared and $V_{CS}$ should reduce to below said single threshold with a first amount.

Next, a second charge transfer measurement process may be performed with a second, smaller size of charge packets being transferred to Cs until it reaches said single voltage threshold again and a second trip event occurs. For example, the second size may be ten times smaller than said first size. The counts value of the second charge transfer measurement process may be recorded. Hereafter, charge equal or proportional to one, or more, of said second size of charge packets may be removed from Cs to cause the trip to clear, and $V_{CS}$ to reduce to below said single threshold with a second amount, wherein the second amount may be less than said first amount. Another amount of charge may be removed from Cs after the second trip, as an alternative.

Subsequently, a third charge transfer measurement process may be performed with a third, still smaller size of charge packets being transferred to Cs until it reaches the single voltage threshold again and a third trip event occurs. For example, said third size may be ten time smaller than said second size. The counts value of the third charge transfer measurement process may be recorded, and according to the present invention may be used with the counts values from said second and first charge transfer measurement processes that proceeded the third charge transfer measurement process to form a final counts value result. The latter may be composed, for example, such that the counts value from said first measurement process may form a first, most significant digit, the counts value from said second measurement process may form a second digit, and the counts value from said third measurement process may form a third, least significant digit. The present invention is not limited to generation of only three digit values in the manner described in the directly preceding. For example, first, second, third and fourth charge transfer measurement processes, with respective first, second, third and fourth sizes of charge packets, may just as well be sequentially performed in a manner similar to that described to generate a four digit final counts value result.

As another example of the directly preceding, the invention may for instance be used to generate a four digit counts value of 4321, wherein said value is the result of five charge transfers with a first charge packet size, four transfers with a second charge packet size, three transfers with a third charge packet size and two transfers with a fourth charge packet size, said fourth size being smaller than said third size, which is smaller than said second size, which is smaller than said first size. To elaborate, the five transfers with the first packet size may have caused $V_{CS}$ to exceed a threshold voltage, causing a first trip event, after which charge equivalent or proportional to one packet of said first size may have been removed from Cs, clearing the first trip, leaving a first most significant digit of 4. This may have been followed by the four transfers with said second charge packet size to cause $V_{CS}$ to exceed the threshold again, resulting in a second trip event. Charge equivalent or proportional to one packet of said second size may then have been removed from Cs, clearing the second trip and leaving a second digit of 3. Next, three transfers with said third charge packet size may have been performed to cause $V_{CS}$ to exceed the threshold again, and a third trip event, with charge equivalent or proportional to one packet of said third size which may have been subsequently removed, clearing the third trip and leaving a third digit of 2. Lastly, two transfers with said fourth packet size may have been performed to cause $V_{CS}$ to exceed the threshold again, resulting in a fourth trip event. Charge equivalent or proportional to one packet of said fourth size may have been removed subsequently from Cs to cause the fourth trip event to clear, and leaving a fourth digit of 1. This may conclude the measurement process, with a counts result of 4321.

The residual value may be stored in the one or other memory for subsequent retrieval, for example retrieval to restore charge equal or proportional to said residual in Cs, or retrieval to communicate the residual value to another circuit, be it in analog or digital format. Once the residual value has been stored in a memory, Cs may be completely or partially discharged without loss of the residual value. Discharging may, for example, be performed during a process to increase charge transfer counts without a requirement for a larger Cs, or the use of smaller charge packets throughout the complete charge transfer measurement process, as is described elsewhere in the current disclosure.

The present invention also teaches that the residual voltage may be measured by a type of a charge-removal process, wherein the amount of charge removed during each removal cycle is small enough to facilitate a sufficient increase in measurement resolution. For example, after the charge transfer process is halted due to the voltage of a storage element being at or above a predetermined reference voltage, a charge removal measurement may be performed to determine the amount by which said storage element voltage exceeds the reference voltage. Packets or units of charge may be sequentially removed from the storage element until its voltage equal said reference voltage. Alternatively, the packets or units of charge may be sequentially removed from the storage element until a trip-event, which caused halting of charge transfer from the sensor element to said storage element, is cleared, i.e. a trip-event is not occurring anymore, implying that the voltage on said storage element is below a trip level. By counting the number of such removals, and knowing the size of the packets as well as the size of the storage element, it may be possible to determine the amount of said residual voltage. The packet size for said charge removal process may need to be adjusted to ensure a more exact measurement of said residual voltage. According to the present invention, such an adjustment may be performed through the use of any relevant circuits or methods, for example parasitic capacitance cancellation (PCC) circuits, as taught in U.S. Pat. Nos. 8,395,395 and 8,659,306 sharing inventors with the current application, may be used, current-mirror circuits may be used, or digital-to-analog converters (DAC) may be used, amongst others.

Advantageously, charge removal as described in the directly preceding section may be performed with the same, or largely the same, circuitry used for the charge transfer process that filled the storage element, for example an accumulation capacitor (Cs).

In addition, the present invention teaches that the above-described charge removal process to determine said residual voltage may be extended as follows. Once charge has been removed from the storage element until the trip event has been cleared and/or the voltage across said storage element is equal to said reference or threshold voltage, the residual voltage may be determined, as described in the preceding. This may be followed by a partial or complete discharge of the storage element, for example, by connecting both of its terminals to ground. Subsequently, charge may again be added to the storage element using a number and size of charge transfers equal to the number and size of charge removals used to clear said trip. For example, the same PCC circuitry and settings and number of counts used for said charge removals may again be used to add charge back to the emptied storage capacitor. This should result in said residual being added back to the storage element, but with a ground or zero Volts reference, which may be advantageous in terms of noise. As will be discussed later during the current disclosure, retaining the residual while removing an amount or all of the charge in a storage element may be paramount to increasing resolution of charge transfer measurement apparatus.

With regards to the PCC technique disclosed above and elsewhere, the present invention teaches that the accuracy of the number of discharges required to lower the voltage of the Cs to below the trip level, may be verified. This may be achieved by a return of charge equal to said number of discharges into said Cs, wherein the return may be performed after the Cs is discharged partially or completely, followed by another removal of the charge equal to said number of discharges from Cs again. In this manner, the accuracy of said return of charge may be verified.

The present invention teaches that it may be important that not too small a fraction of the amount of charge representative of said residual voltage be returned to the Cs in the above, as this may adversely affect resolution. In other words, the amount of charge returned must be as close as possible to the charge representative of said residual voltage. Accordingly, a process as described to verify the accuracy of said charge return may be advantageous. Conversely, when the amount of charge returned to the Cs exceeds the amount of charge representative of said residual voltage, the present invention teaches that it may then be necessary to ensure that every repetition of the measurement process returns the same excess amount, as to avoid causing deltas in counts values or measurement results. Such deltas should ideally be caused by user interaction alone.

The resolution of charge transfer measurement circuits is fundamentally tied the number of charge transfer counts, as is known in the art. To elaborate, if a thousand counts are required to fill a storage element up to a reference level, it implies that the measurement system can discern sensor element changes with a resolution of around $2^{10}$ or 1024 levels. In other words, and as an example, if the sensor element changes sufficiently to cause a reduction in counts down to nine-hundred-and-fifty, this should be easily discernible.

Methods and apparatus taught by the present invention to increase the nominal counts value of a charge transfer measurement process, and thereby its resolution, have the advantage of not involving a significant increase in storage element size e.g., an accumulation capacitor, or a decrease in charge packet size down to non-optimum values. Using a too small charge packet size may negatively affect noise susceptibility of the measurement system. Increasing the storage capacitor size may directly increase cost, especially for integrated circuit embodiments. Larger storage capacitors may also result in very small increases in storage capacitor voltage for each charge transfer cycle, which may heighten noise susceptibility of the measurement process.

According to another embodiment of the present invention, charge transfer counts and resolution may be beneficially increased as follows. During a first period, charge may be transferred from a sensor to a storage element while noting the number of charge transfer counts required to fill said storage element up to a reference level, as is known. When the storage element reaches the reference level, the charge transfer process and increase in counts may be paused. A predetermined amount of charge may subsequently be removed from the storage element during the pause e.g., approximately 50% of the charge may be removed. It is very important to note that the charge removed must preferably be a fixed amount and not for example be half of the charge after the trip which would mean half of the residual above the Vtrip is also removed. This means a subtraction of charge must be performed and not a division of charge. It is imperative, according to the present invention, that said subtraction removes a non-fractional amount of charge, to ensure that the residual voltage is maintained.

For example, consider the case where 60 pico-coulomb of charge is to be removed from an accumulation capacitor of 120 pF. If the accumulation capacitor has been filled up to 1.0004V before causing a trip event for a trip voltage of 1V, the residual voltage of 0.4 mV represents a residual charge of 48 femto-coulomb. If 60.048 pico-coulomb is removed from said accumulation capacitor, the residual voltage is lost, given the resulting accumulation capacitor voltage of 0.5V. By removing exactly 60 pico-coulomb, the remaining charge of 60.048 pico-coulomb retains said residual voltage, as the voltage over the accumulation capacitor will now be 0.5004V.

Ideally, we want to preserve (and carry over) this residual charge into the next round in order to accumulate the residuals over time. It is to be appreciated that the present invention is not limited to charge transfer and/or capacitive sensing measurements in said accumulation of residuals to increase resolution, but may be practised in or by any measurement or sensing method or apparatus where a residual or fractional part of a result is traditionally discarded. According to the present invention, by accumulating a plurality of said residuals or fractional parts over time, a resultant value which is sufficiently large to allow measurement may be obtained. In addition, according to the present invention, because the number of accumulations or accumulation steps are known, said resultant value may be divided by said number to determine the original residual or fractional part exactly. For example, if a measurement process can measure with a resolution of 1V, and an initial measurement result provides a value of 1V as an answer, but ten repetitions of the accumulation of any possible residual increases the measurement result to 2V, it may be determined that the residual is 0.1V, and that the correct initial measurement is 1.1V.

After preserving and carrying over said residual charge, the charge transfer process may be resumed, with the number of counts further incremented from the value before said pause. When said storage element reaches the reference level again, the charge transfer process and increase in counts may again be paused, with another removal of a predetermined amount of charge from said storage element (Cs), while maintaining any residual voltage above the trip level, which may be executed. The process may be repeated until a target range of counts is reached, or until another event, for example a time-out event, halts the process. At this point, the number of charge transfer counts, or another associated parameter, may be used as the measurement result. Due to the carry-over and accumulation of the residual voltages of each repetition of said process, resolution of the overall measurement process may be significantly increased. For example, if a proximity event causes a 0.4 mV change in the voltage of an accumulation capacitor, such a small change may not even reflect as a change of one count if a traditional charge transfer process is followed. However, if the above process is followed and the 0.4 mV residual is maintained and accumulated during each of, e.g., twenty repetitions, the proximity event may result in 8 mV of change, which may translate to, e.g., eight counts of charge transfer, allowing said event to be detected.

The amount of charge removed during each pause in the above may be adjustable, and may use parasitic capacitance cancellation (PCC) techniques as taught in U.S. Pat. Nos. 8,395,395 and 8,659,306 which shares inventors with the current application. Other techniques to adjust the amount of charge removed during said pauses, or during other periods, may also be used. The present invention further teaches that methods and apparatus as disclosed elsewhere in the current application to measure a residual voltage on the storage element after halting, or pausing, the charge transfer measurement process, may be used with the methods and apparatus for increasing the nominal counts value as described in the directly preceding. In addition, when said amount of charge is removed after a particular pause in the charge transfer process, the amount should be selected such that any residual voltage above a threshold or reference voltage is maintained. For example, if the reference or trip voltage is at 1V, and charge transfer cycles before said pause fills a storage capacitor up to 1.005V, the 5 mV residual should ideally be maintained by removing a fixed amount of charge and thus reducing the Cs Voltage by a fixed amount e.g., 500 mV, and not 505 mV. I.e., the amount of charge removed is a fixed value and not dependent on the level in the accumulation capacitor so as to carry the residual charge above the threshold over into the next cycle.

Maintaining the residual voltage as described above may also result in an amplification of said residual, and thereby increased resolution. Consider an example where the reference or trip voltage is at 1V and 1000 charge transfer cycles before said pause fills a storage capacitor up to 1.0005V, or 0.5 mV above the threshold level. If charge is removed during the pause in charge transfers to reduce the Cs voltage by 1V, the storage capacitor voltage reduces to 0.0005V. If nothing changed in terms of the sensor capacitance and environment, another 1000 charge transfer cycles should fill the storage capacitor with charge causing another 1.0005V change in voltage, leaving the storage capacitor at 1.001V. Clearly, the residual voltage has been increased from 0.5 mV on the storage capacitor for 1000 counts to 1 mV on the storage capacitor for 2000 counts, or this may reduce the counts before the second trip is reached to 1999. Repeating the process should further increase said residual, and as such the resolution. If a 0.5 mV residual is present after 1000 cycles, it may imply that the counts cannot actually see this 0.5 mV for a quantization of 1 mV. If the 1000 charge transfer cycles are repeated for a further thousand times, said 0.5 mV may result in a counts change of 500. This is clearly a significant increase in resolution that may be measured. The cost is merely the increase in measurement time and not much in terms of circuitry. If a 1000 count measurement takes 1 milli-second, the thousand repeats will take at least one second. However, some measurements may require the higher resolution and accuracy with a slow response rate.

In another exemplary embodiment of the present invention, said residual voltage may be acquired with a sample-and-hold (S&H) circuit. The Cs, or another storage element or member, may then be partially or fully discharged, for example, by connection of both terminals of said Cs to ground. The value captured with said S&H circuit may then be used to store a charge equal or proportional to said residual in the Cs, for example to store said residual in the Cs again after it has been completely discharged, i.e. the residual is restored with ground as reference. This may hold an advantage in terms of noise. Discharging a Cs through connection of both its terminals to ground may also offer a simple and fast discharging technique.

The above described S&H circuit based embodiment for acquisition of said residual voltage and restoring it in Cs with a ground reference, or the earlier described embodiment that utilize a charge removal process to determine the residual, and a subsequent charge transfer process to restore the residual in a discharged Cs, may be used advantageously in any of the disclosed embodiments of the present invention, or others, to retain and/or accumulate instances of said residual during charge transfer measurements processes.

The present invention is not limited to the use of a S&H circuit to acquire residual voltages only with charge transfer and/or capacitive sensing apparatus and method, but may be practised via any relevant measurement embodiment. For example, according to the present invention, a S&H circuit may be used in any capacitive sensing application to acquire residual voltages or fractional parts of results during measurement processes where said residuals or fractional parts are accumulated and/or used to increase measurement resolution. The present invention may further be embodied in any other sensing application, for example inductive sensing, optical sensing, temperature sensing and so forth, where a S&H circuit is used to acquire a residual voltage or fractional part of a result, and where the residual or fractional part is accumulated over time to increase measurement resolution.

With mutual-capacitance measurements a proximity or touch event typically reduces the capacitance measured on the target capacitor (Cm) as the member coming into proximity of or touching the measured mutual-capacitor (Cm) actually steals away charge. This means in a standard charge transfer measurement the number of transfers, or counts, required to charge the accumulation capacitor (Cs) to a reference level should typically increase.

This increase in counts may not be desirable in a trackpad application where a hundred or more nodes (Cm's) may need to be measured within a given period of time in order to maintain a desired response rate. The increased number of counts required imply a longer period for the voltage of Cs to reach a reference level.

In self-capacitance measurements the number of counts typically reduce when a member come into proximity of the target capacitor (Cm) because the proximity or touch event increase the capacitance of the Cm.

In yet another embodiment of the present invention, a reference capacitance may be configured to be used with charge transfer methods and apparatus such that charge transfer between the reference capacitance (Cref) and a storage capacitance (Cs) should result in a first target counts value e.g., in a counts value of 1000. A sensor capacitance (Cm) may subsequently be configured to be used with said charge transfer methods and apparatus such that charge transfer between the sensor capacitance (Cm) and said storage capacitance (Cs) should result in a second target counts value which is more than the first target e.g., in a counts value of 2000. Hereafter, during each charge transfer cycle of a charge transfer measurement process, charge from said reference capacitance (Cref) may be added to said storage capacitance while charge from said sensor capacitance (Cm) may be removed from the storage capacitance. Since said second counts target is more than said first counts target, implying smaller packets or units of charge used during each cycle, this will result in the charge or voltage of the storage capacitance taking longer to reach a predetermined reference level. In other words, less charge than the charge unit or packet of charge from Cref is transferred to Cs each cycle. In a mutual-capacitance measurement a touch event will now result in a reduced number of transfers required to reach the reference or trip voltage on Cs. In other words, it will result in a lower counts value, contrary to the traditional increase in counts observed for a mutual-capacitance touch event. To clarify, consider the above example. Due to the setup of 2000 counts for the Cm and 1000 counts for the Cref, charge packets or units from Cm should be half the size of those from Cref. Therefore, if packets from Cm are subtracted from Cs while packets from Cref are added to Cs during each transfer cycle, packets half the size of those of Cref are effectively added to Cs, implying a 2000 count result. When a mutual-capacitance touch event occurs, the sensor capacitance Cm decreases, which may cause less charge being subtracted from the Cs during each transfer cycle, causing a lower counts result, as the Cs may then fill up faster. For example, if a touch event causes Cm to decrease by 50%, charge packets from Cm should be one quarter of the packets from Cref. This implies that packets which are three-quarter the size of the packets from Cref may effectively be added to Cs during each charge transfer cycle, which should result in 1500 counts before a trip event. In this manner, counts reduced from 2000 counts to 1500 counts during a mutual-capacitance touch event, contrary to the traditional rise in counts associated with mutual-capacitance proximity and touch events.

In a further embodiment according to the present invention, the effect of Cm may be nullified through use of PCC structures and methods to ensure that the storage capacitor (Cs) does reach said predetermined reference level (trip) after a number of charge transfers equal to said first counts target using the Cref only, e.g., that a counts value of 1000 is reached. For example, charge equal to the charge from Cm may be added to the Cs during each charge transfer cycle to ensure that a counts value equal to the counts of the Cref is reached during a charge transfer measurement cycle. This would mean the charge added during each charge transfer cycle is:

$$Q_{ADDED}=Q_{CREF}-Q_{CM}+Q_{PCC} \quad (2)$$

When the charge added by PCC is equal to the charge from Cm, or $Q_{CM}=Q_{PCC}$ (2) above becomes:

$$Q_{ADDED}=Q_{REF} \quad (3)$$

In a touch event the sensed capacitor may decrease and becomes:

$$C_{TOUCH}=Cm-\Delta Cm \quad (4)$$

This means charge added to the Cs during each charge transfer cycle becomes the charge from the reference capacitance minus the charge from the touched sensed capacitor plus the charge added by PCC, or:

$$Q_{ADDED}=Q_{CREF}-Q_{CTOUCH}+Q_{PCC} \quad (5)$$

Where the charge from the touch sensed capacitor is less than that of Cm originally, given by:

$$Q_{CTOUCH}=Q_{CM}-Q_{\Delta CM} \quad (6)$$

Therefore (5) above becomes $$Q_{ADDED}=Q_{CREF}-Q_{CM}+Q_{\Delta CM}+Q_{PCC} \quad (7)$$

Since $Q_{CM}=Q_{PCC}$ due to PCC, (7) above becomes:

$$Q_{ADDED}=Q_{CREF}+Q_{\Delta CM} \quad (8)$$

In other words, giving an increase in the amount of charge transferred to Cs that is directly related to the change in Cm and an associated reduction in charge transfer counts.

The above may be achieved through various implementations, but the concept for implementing this embodiment is simple. For mutual capacitance measurements firstly create a Cref and subtract Cm during each charge transfer cycle (CT), then add dummy capacitance to negate (best as possible) the effect of Cm to end with the effective charge of Cref plus any change in Cm transferred during each CT cycle.

When the above is used to measure a change in mutual-capacitance due to a user proximity or touch event (which reduces the sensor capacitance value), the charge transfer counts should therefore decrease, since less charge is removed from the storage capacitor during each charge transfer cycle. This is contrary to traditional charge transfer measurements of mutual-capacitance changes, where a user proximity or touch event typically causes an increase in counts.

Conversely, when the above is used to measure a change in self-capacitance due to a user proximity or touch event (which should increase the sensor self-capacitance value), the charge transfer counts should increase, since more charge is removed from the storage capacitor during each charge transfer cycle. This is contrary to that obtained with traditional self-capacitance charge transfer measurements, where a proximity or touch event normally leads to a decrease in counts.

It may be desirable to achieve a decrease in charge transfer counts for proximity and touch events, irrespective of whether a mutual-capacitance or self-capacitance measurement is performed. According to the present invention, the above-described embodiment may be used to achieve this, where mutual-capacitance measurements are performed as described. For self-capacitance measurements, however, charge packets from the sensor capacitance as well as the reference capacitance may be added to said storage capacitance. This may lead to a decrease in counts since the storage capacitance may be filled faster. PCC circuits and methods may be used to restore counts to the range of said first target e.g., to restore counts to the range of one-thousand counts. When a proximity or touch event is then measured with self-capacitance, counts may decrease, as expected.

Another advantage of the above embodiment is that the total amount of charge associated with the Cm is removed via the use of PCC and the counts required to reach the reference or trip voltage on Cs is ideally purely related to the Cref, and in a proximity or touch event the change in counts is directly related to the change in Cm (i.e. delta Cm) due to the said proximity or touch event.

The Cref may be on-chip selectable capacitor combinations or may be an off-chip device. The implementation may be affected by temperature effects, for example the Cm may change with changes in temperature, and this may be countered by a specific Cref with a similar temperature coefficient. An on-chip Cref also reduce pin-count especially in track pad devices with a high node count.

For other implementations such as, for example, Specific Absorption Ration (SAR) applications, it may be desirable to use external reference capacitors with or without said on-chip reference capacitors. This may be done to realize a specific size of reference capacitor, or to achieve a specific temperature response, for example.

The concept of using a reference channel in a capacitive, or other sensing, circuit, wherein said reference channel is not influenced by a user, is known and discussed. If the counts value of a charge transfer measurement is increased, with the goal to increase signal-to-noise-ratio (SNR), the residual as discussed herein should be retained.

In another related exemplary embodiment of the present invention with a reference capacitor, a separate Cref (reference measurement capacitor) may be used with an additional reference channel accumulation capacitor (Cs-ref). Charge transfers may be performed alternatively with said Cref and a sensed capacitance (Cm), using the same paths for charge transfer as far as possible, for example the same current-mirror and PCC circuits and settings, but with different accumulation capacitors. E.g., a dedicated accumulation capacitor (Cs) is used to transfer charge from said Cm to said Cs and the Cs-ref is used to transfer charge from said Cref to said Cs-ref. This may have the advantage that noise, for example low-frequency noise such as 1/F noise, step-change noise or so-called popcorn noise, should also be present with a high level of correlation in the measurements of the reference channel comprising Cref and Cs-ref, and may therefore be identified and removed from measurements performed with the Cm. In a similar manner, temperature effects that influence measurement with Cm and Cs should also be partially or fully present in the measurements with Cref and Cs-ref, and may therefore be identified, removed and/or compensated for.

Both the Cref and Cs-ref may be located within an integrated circuit used for said measurements, or off-chip. An off-chip Cref may be required if for example temperature effects originating in the Cm electrode must be countered.

An interleaved measurement approach as disclosed above may assist to reduce such low-frequency and/or step-change noise present in PCC and/or charge transfer circuits. In addition, the present invention teaches that the manner of interleaving measurements with the Cm and Cs on the one hand and said Cref and Cs-ref on the other hand, need not be limited. It may, for example, be performed on a balanced time base using equal periods, i.e. 50%-period time multiplexing, alternatingly or it may be done, as another example, in a manner where the Cref and Cs-ref measurement is only performed intermittently such as once for every hundred measurements with Cm and Cs. Or it may be performed in a reactionary manner, based on the values and/or processing of the one or other parameter or parameters.

The present invention further teaches that any relevant apparatus or method may be used to discharge an accumulation capacitor (Cs), or other storage device, during charge transfer measurements as disclosed in the present invention, but that the residual voltage above a trip voltage level should be retained and then the charge transfer process is repeated a number of times. By accumulating instances of this residual over multiple repetitions of measurement cycles where charge is added via charge transfer of units of charge from the Cm (measurement capacitor) to the Cs (accumulation capacitor) till the Vtrip level is reached and the number of transfers recorded, and then the CS charge is removed again but the residual carried over and the process repeated multiple times, measurement resolution may be increased with only the cost of time.

For example, when said Cs is emptied by discharging to another capacitor, charge should not be merely divided between the two capacitors, as this may result in the partial or complete loss of said residual voltage over a number of repeats. Reduction of the charge in Cs should ideally be performed in the manner of a charge subtraction and not charge division. For example, half of the charge stored in Cs may be subtracted using the one or other apparatus and/or method, according to the present invention, while maintaining a residual value or a fractional part of the charge. If the charge stored in Cs is merely divided, said residual will also be divided and not fully retained.

Charge may also be removed from the Cs via a path using PCC circuitry and techniques, as described earlier. The inventors have noted that use of PCC with current-mirror circuitry to remove large charge quantities may result in noise due to step-changes or 1/F type noise in the current mirrors. The present invention teaches that such step-change-noise may need to be detected and minimized to ensure that the PCC-based discharge of Cs remains within acceptable limits for signal-to-noise ratio (SNR). Other sources of noise may naturally contribute to the SNR realized, although step-change-noise may become dominant in some instances as it falls within the parameters of the changes in Cm capacitance of interest.

The present invention teaches apparatus and methods to increase the resolution of any measurement or sensing process through the accumulation of small residual values by which a measurement result exceeds a threshold, and wherein said residual values are traditionally discarded or ignored. According to the present invention, by accumulation of said residual values over time, for example in an accumulator, an accumulated result that is large enough to be measured may be obtained. For example, a repetitive measurement process may be executed until the one or other condition is met, wherein said process comprises the acquisition and accumulation of said residual values. This may allow said accumulated result to be used with said measurement result, or with a plurality of measurement results to increase measurement resolution. The present invention is not limited to a specific measurement or sensing type, method, or apparatus in this regard.

BRIEF DESCRIPTION OF THE DRAWINGS

The invention is further described by way of examples with reference to the accompanying drawings in which.

DETAILED DESCRIPTION OF EMBODIMENTS

To further clarify the disclosure of the present invention, the following descriptions relating to the appended drawings are presented. These should not be construed as limiting to the claims of the invention and are merely used to support clarity of disclosure. A large number of other equivalent embodiments may be possible that still fall within the spirit and scope of the present invention, as may be recognised by one skilled in the relevant arts.

Figure 1:
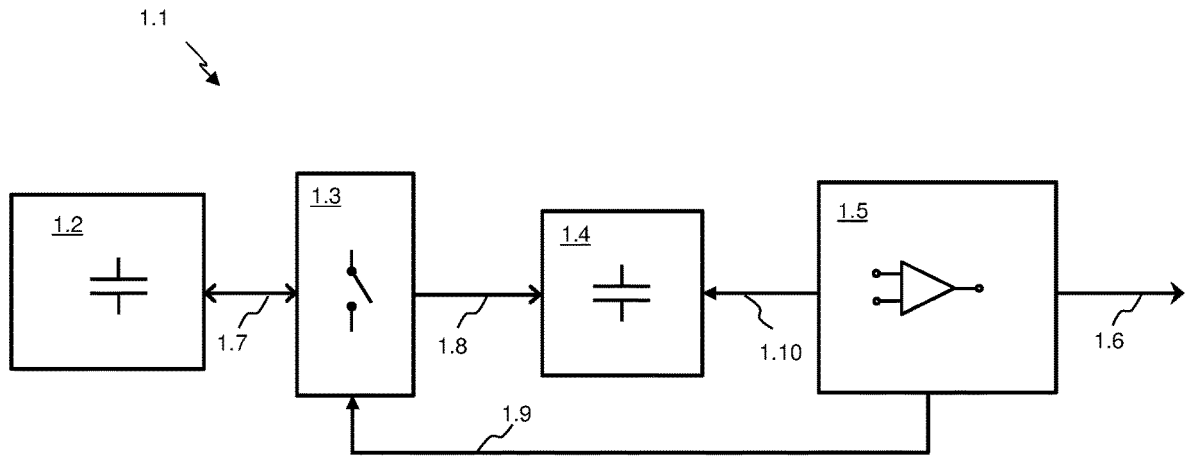
FIG. 1 shows a block diagram of an exemplary charge transfer measurement system.

FIG. 1 depicts an exemplary charge transfer measurement system block diagram at 1.1. It will briefly be described as basis for subsequent disclosure. A sensor element 1.2, for example a capacitive sensor element, may be connected to a charge transfer block 1.3, with the latter which may make use of any number of controlled switching elements to repetitively store charge in sensor element 1.2 via path 1.7 and then transfer it to a storage element 1.4 via paths 1.7 and 1.8. Storage element 1.4 may be a storage or accumulation capacitor $C_S$, for example. A measurement-and-processing block 1.5 may control the switching elements in charge transfer block 1.3, as depicted by 1.9. Block 1.5 may also measure the voltage on storage element 1.4 via path 1.10, and may process analog and/or digital values and communicate these to other circuitry via a connection 1.6, which may be wired or wireless. It should be appreciated that the present invention need not be limited to a specific capacitive sensing measurement type, for example self-capacitance measurements, but may also be practised with mutual-capacitance measurement apparatus and methods. Moreover, it need not be limited to capacitive sensing, but may be practised with any type of sensing that utilizes charge or energy transfer to detect changes in any type of sensor or sensors and/or their environment. Specifically included but not limited to photo sensors, IR sensors, inductive measurements, Voltage measurements, temperature, Hall plate or MEMS type sensors.

Initially, sensor element 1.2 may be emptied/charged down/up to a specific predetermined level. For example, it may be discharged to 0V. This may be followed by a number of charge transfer cycles. During each cycle, charge stored in sensor element 1.2 may be transferred to storage element 1.4, with the charge transfer cycles which may be under the control of measurement-and-processing block 1.5. The latter may measure the voltage over storage element 1.4, or another parameter resulting from the charge transfer process, and may keep count of the number of charge transfer cycles, known as counts in the art. After a predetermined number of counts, the charge transfer process may be halted, and block 1.5 may measure the voltage over storage element 1.4, or another parameter resulting from the number of charge transfer cycles, and may output this voltage or parameter via 1.6 as a result. Alternatively, block 1.5 may halt the charge transfer process once the voltage over storage element 1.4 reaches a predetermined threshold level, and may output the number of charge transfer counts, or a value associated with it, via 1.6. Block 1.5, together with or apart from block 1.3 may comprise any manner of circuitry and software. For example, it may comprise PCC circuitry as disclosed in U.S. Pat. Nos. 8,395,395 and 8,659,306 and elsewhere in the prior art, it may comprise analog signal processing circuits, digital signal processing and logic circuits and so forth.

Figure 2:
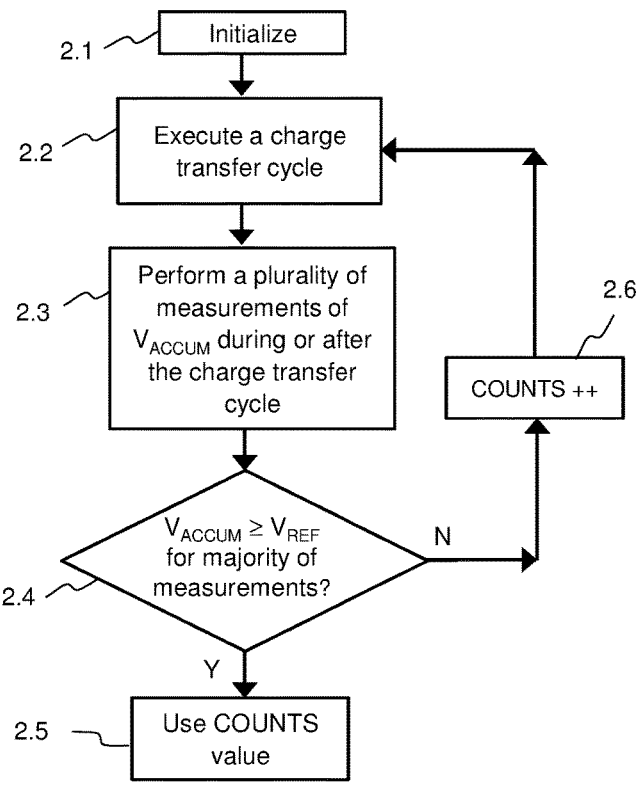
FIG. 2 shows an exemplary flowchart for using a majority-rules approach to control a charge transfer measurement process.

A majority-rules criterium may be used to decide when to halt a charge transfer process, according to the present invention. This may be done to improve noise immunity. An exemplary flowchart of a method using a majority-rules test is depicted in FIG. 2. It is largely self-explanatory, but will be briefly described for clarity. First, an initialization step 2.1 may be executed. This may involve clearing counts values, ensuring that storage and sensor capacitors are at specific levels of charge etc. Hereafter, a charge transfer cycle may be executed, step 2.2. It should be appreciated that step 2.2 need not be limited to a single charge transfer cycle, but may involve any number of charge transfer cycles. Next, a plurality of measurements of the voltage over a storage or accumulation capacitor may be made, as shown at 2.3. Steps 2.2 and 2.3 may also be combined, with said voltage measurements which may be performed during a particular charge transfer cycle or cycles. At 2.4, a check is performed to determine whether the voltage on the storage or accumulation capacitor equaled or exceeded a reference voltage during a majority of said plurality of measurements. For example, if five measurements were made, three of the five needs to be equal to or above said reference voltage. If a majority does rule, the charge transfer counts value may be used, as at 2.5. If not, the counts value may be incremented by one, or by any relevant number, as at 2.6, and the process may return to step 2.2.

Figure 3:
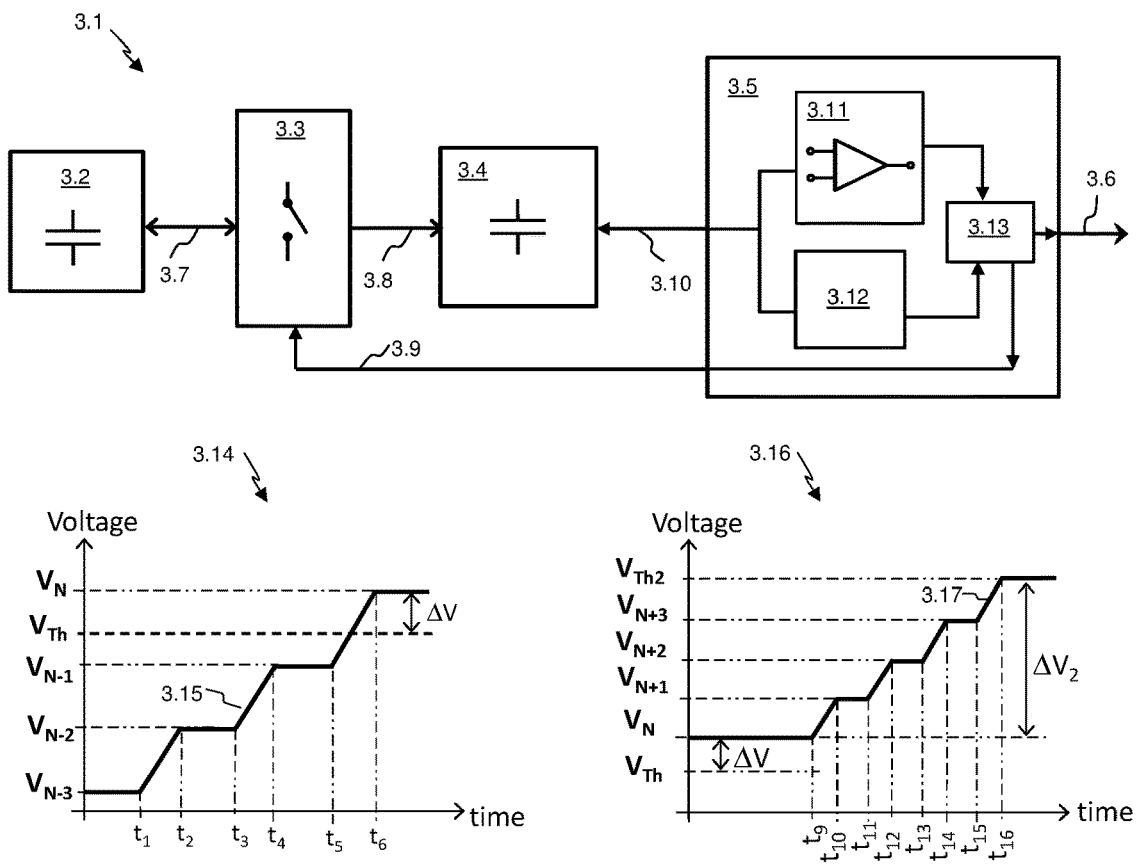
FIG. 3 shows an exemplary embodiment of a charge transfer measurement system with increased resolution through measurement of a residual voltage on the storage element.

FIG. 3 presents a block diagram at 3.1 of an exemplary embodiment which may be used to increase the resolution of a charge transfer measurement process. It is similar to FIG. 1, with a sensor element 3.2, a charge transfer block 3.3, a storage element 3.4, charge transfer paths 3.7 and 3.8, control line 3.9, monitoring path 3.10 and output path 3.6. However, measurement-and-processing block 3.5 differs from block 1.5, and will be described in more detail. Block 3.5 may comprise a first measurement block 3.11, a second measurement block 3.12 as well as a processing-and-control block 3.13. Measurement block 3.11 may be used during a first stage of a measurement process, and may for example comprise a comparator circuit. During said first stage, blocks 3.2, 3.3 and 3.4 may be used in a manner similar to that described for FIG. 1, wherein charge is repetitively stored in sensor element 3.2 and transferred via block 3.3 to storage element 3.4, similar to what is known in the art. First measurement block 3.11 may be used to monitor the voltage of storage element 3.4, for example a storage or accumulation capacitor. Once the voltage on the accumulation capacitor 3.4 equals or exceeds a first threshold voltage $V_{Th}$, measurement block 3.11 may signify this to processing-and-control block 3.13, which may then halt the charge transfer process, ending said first stage.

An exemplary graph 3.15 for the voltage over accumulation capacitor 3.4 up to a first trip event is presented at 3.14 in FIG. 3. At time t1 after N−3 charge transfers, the voltage over capacitor 3.4 may be at a level of $V_{N-3}$, as illustrated. This may increase to $V_{N-2}$ during charge transfer N−2, ending at time t2, and to $V_{N-1}$ between time t3 and t4 during charge transfer cycle N−1 which ends at time t4. At this point, the voltage may be close to the reference or first threshold voltage $V_{Th}$. During the N-th charge transfer the voltage of accumulation capacitor 3.4 may increase above said first threshold $V_{Th}$ to a value of $V_N$ between time t5 and t6. The charge transfer process may be halted at this point after N counts. As shown at 3.14 in FIG. 3, the voltage of the accumulation capacitor 3.4 may exceed the first threshold $V_{Th}$ value with a residual voltage of ΔV. The value of ΔV may depend on the charge packet size used during the N-th transfer cycle. In prior art chart transfer measurement systems, this residual voltage was discarded, with only the number of counts used as measurement result. However, the present inventors have realized that the residual voltage holds valuable information which may be utilized to further increase the resolution of measurements. For example, after halting the charge transfer process at N counts, measurement block 3.12 may be used during a second stage of said measurement process to measure the residual voltage on accumulation capacitor 3.4, and processing-and-control block 3.13 may use this information in the one or other manner with the number of counts N to calculate a measurement result. This result may then be communicated over connection 3.6, which may be wired or wireless.

One exemplary manner in which said residual voltage may be measured and processed is via an ADC. Block 3.12 may comprise any form of analog-to-digital converter, and may use it to only digitize the residual ΔV by which the accumulation capacitor voltage exceeds a predetermined threshold, for example said first threshold $V_{Th}$. The digital representation of said residual may then be used by block 3.13, or by other circuitry or software, in combination with the number of charge transfer counts, or another parameter, to increase the resolution of the charge transfer measurement result.

It should be appreciated that the present invention is not limited in the manner by which said residual ΔV is measured. For example, the residual may also be determined by a further charge transfer measurement cycles using a smaller transfer-packet size and/or a smaller accumulation capacitor size or ADC or S/H techniques.

As an example of determining said residual through further charge transfers using smaller packets of charge and a second threshold $V_{Th2}$ as depicted at 3.16 may potentially be used for the embodiment depicted in FIG. 3. To elaborate, after said initial transfer process halts after N transfers, the voltage $V_{CS}$ of an accumulation capacitor Cs may be at a value of $V_N$, as shown by graph 3.17. At a time t9, a further charge transfer measurement process may transfer a first smaller, but known packet of charge to Cs, which may result in an increase of $V_{CS}$ from $V_N$ to $V_{N+1}$ between t9 and t10, as shown. Subsequently, the further charge transfer measurement process may perform three more transfers with said smaller, but known, packets of charge between t11 and t12, t13 and t14 and t15 and t16 respectively, which may cause the voltage of Cs to reach a second threshold $V_{Th2}$ upon which the further charge transfer measurement process may be ended. As described during the Summary of this disclosure, because the values of the first threshold $V_{Th}$ and the second threshold $V_{Th2}$ are known, as well as the size of Cs and that of said smaller packets and the number of further transfers that were required for $V_{CS}$ to reach said second threshold, the value of the residual ΔV may be calculated. This may be used to increase the resolution of the overall charge transfer measurement. It is to be appreciated that the preceding is purely exemplary, and should not be construed as limits of the current invention.

Figure 4:
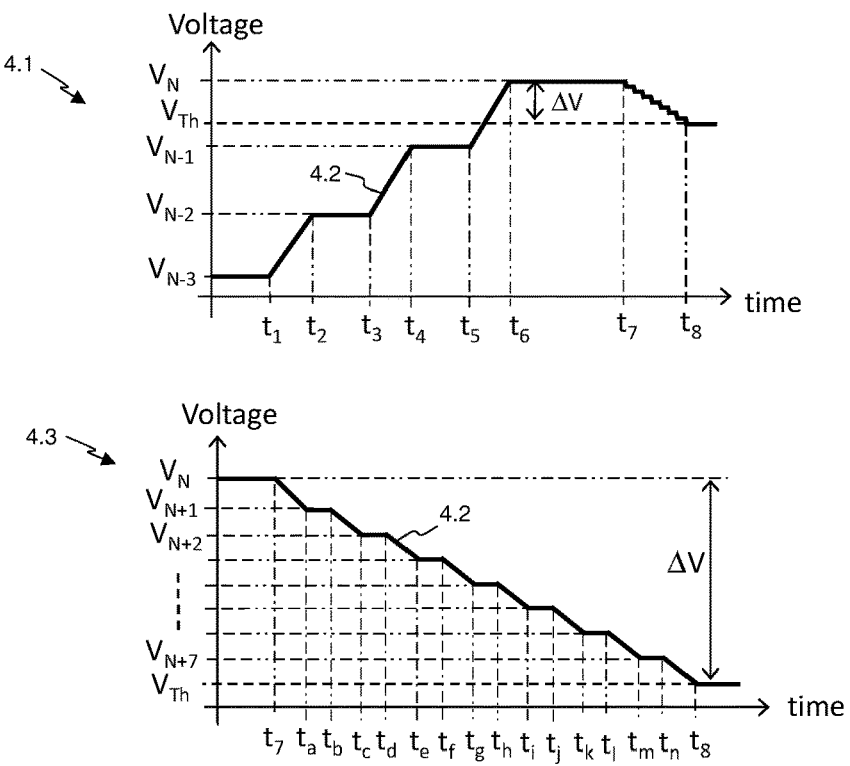
FIG. 4 shows exemplary voltage versus time graphs for a charge transfer measurement system using a charge removal process to determine a residual voltage.

According to the present invention, it may also be possible to measure the above-described residual voltage through a charge removal process subsequent to a charge transfer process. FIG. 4 presents an exemplary voltage graph 4.2 for an accumulation capacitor during these transfer and removal processes. For the graph at 4.1, the period t1 to t6 corresponds to that of FIG. 3, and will not be described again for brevity's sake. The voltage of said accumulation capacitor may be reduced from $V_N$ to the threshold or trip voltage $V_{Th}$ during the period between t7 and t8 through a charge removal process. The graph 4.2 at 4.3 is merely an enlarged view of the period t7 to t8 in the graph 4.2 at 4.1. After halting the charge transfer process at N counts, the voltage of said accumulation capacitor at time t7 may be at a value of $V_N$, wherein the difference between $V_N$ and $V_{Th}$ may form said residual voltage ΔV. According to the present invention, sequentially removing small packets or units of charge from said accumulation capacitor while noting the number of charge removal cycles may be used to determine the value of said residual voltage. Essentially charge transfer in reverse. For example, the graph 4.2 at 4.3 shows accumulation capacitor voltage during eight charge removal steps in exemplary manner, with charge removed between t7 and ta, tb and tc, td and te, tf and tg, th and ti, tj and tk, tl and tm and between tn and t8. As is evident from comparing the voltage step sizes for the charge transfer and charge removal processes depicted at 4.1, charge may be removed using much smaller units or packets of charge. In other words, the charge removal process may be used to measure said residual voltage with much higher resolution than that used during the charge transfer process.

Figure 5:
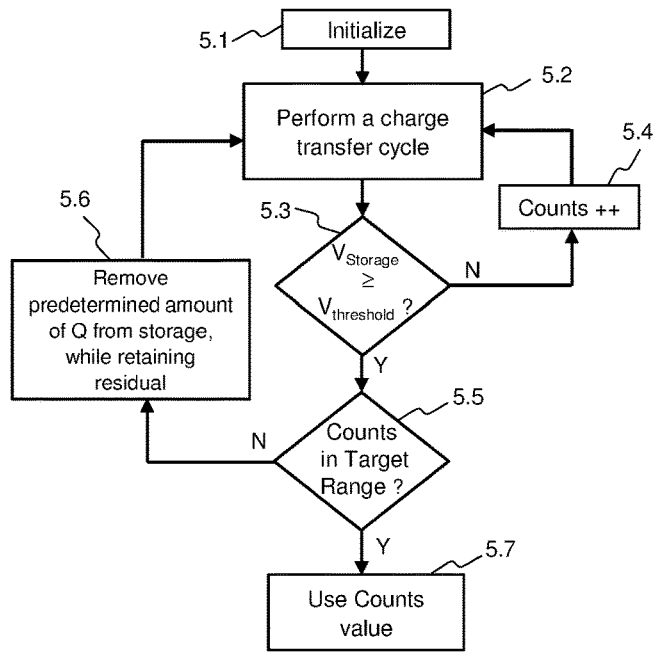
FIG. 5 shows an exemplary flowchart for a method to increase the nominal counts range and resolution of a charge transfer measurement process.

FIG. 5 presents an exemplary flowchart for a process or method which may be used to significantly increase the counts range of a charge transfer measurement without requiring a severe reduction in charge packet or unit size, or an impractical or costly increase in the size of an accumulation capacitor used during said charge transfer measurement. Such an increase in the counts range may offer higher resolution measurements. During a first step 5.1, an initialization routine may be performed. This may entail any steps required to place the charge transfer measurement system in an optimal state to start measuring from. Next, a charge transfer cycle, or a number of charge transfer cycles may be performed, as shown at 5.2. At 5.3 the voltage of a storage or accumulation capacitor may be checked to determine if a predetermined reference or threshold voltage level has been reached or exceeded. If not, a counts value for the number of charge transfer cycles may be incremented, as at 5.4, and the process may return to step 5.2. If the voltage of the storage capacitor does equal or exceed said reference level, another check may be performed at 5.5 to determine whether the counts value is in a desired range e.g., in the range of twenty thousand counts. If not, the process may move to step 5.6 where a predetermined amount of charge may be removed from the storage or accumulation capacitor, followed by a return to step 5.2. During the removal of charge, charge representative of any residual voltage above the predetermined reference or threshold should be retained, as discussed elsewhere during the present disclosure. It should be noted that the counts value remains unchanged when moving from step 5.5 to step 5.6 and then back to step 5.2. In other words, the counts value is frozen while traversing loop 5.3-5.5-5.6-5.2, and resumed when loop 5.2-5.3-5.4 is executed again. When returning to step 5.2 from step 5.6, the process should typically perform a number of repetitions of the loop formed by steps 5.2, 5.3 and 5.4 before exciting to step 5.5 again, due to the amount of charge removed during step 5.6. In this manner, the counts value may be increased until it enters the desired target range, leading to the process which may move from step 5.5 to step 5.7. For each repetition of loop 5.3-5.5-5.6, an amount of charge representative of the residual should remain in the storage element, leading to an accumulation of residuals. This may improve measurement resolution.

The present invention further teaches that circuitry and software used for PCC may also be used to remove the predetermined amount of charge during step 5.6 in the above. Further, it may be beneficial to dynamically adjust the amount of predetermined charge to be removed, based on the one or other parameter or condition. According to the present invention, step 5.6 may comprise a number of sub-steps, wherein each sub-step removes a portion of said predetermined amount of charge. The number of sub-steps and the size of said portions may also be dynamically adjusted.

To further clarify the above, a detailed example will be given. Consider a charge transfer measurement circuit with the following characteristics:

$C_{Accumulation} \approx 120$ pF

Nominal counts until trip≈1000

Maximum charge removal ability≈10 pF

Desired target counts range≈20000

When the above circuit exits the loop formed by steps 5.2, 5.3 and 5.4 for a first time, the counts value should be around 1000. If the maximum charge removal is then used six times to perform one iteration of step 5.6, an amount of charge representative of 60 pF, or half the capacitance of the accumulation capacitor, should have been removed, equating to approximately 500 counts. This implies that another 500 counts of charge transfers should be performed before loop 5.2-5.3-5.4 is excited again, with counts now at a value of 1500. A further thirty-seven repetitions of the loop 5.2-5.3-5.5-5.6, each repetition contributing 500 counts to the total counts value, should be required before the desired target counts of 20000 is reached.

According to the present invention, the noise-band for the above-described process with increased count value range should be similar or even better than that of the nominal counts process.

The present invention is not limited in terms of the desired target counts range. For example, count values in the range of one-hundred-thousand or one-million could be realized. It may be noted that to accommodate a counts value around one-million, a twenty-bit counter may be required.

Figure 6:
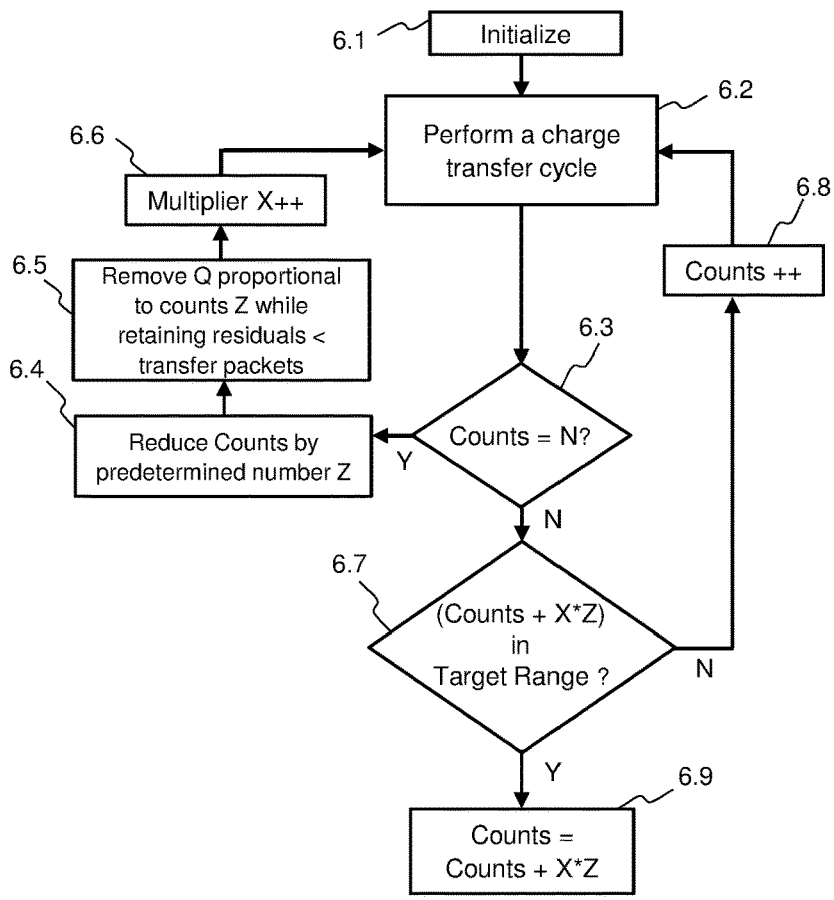
FIG. 6 shows another exemplary flowchart for a method to increase the nominal counts range and resolution of a charge transfer measurement process.

FIG. 6 shows an exemplary flowchart for an alternative process to increase the counts of a charge transfer process, and the resolution, without an unacceptable reduction in the size of charge packets or units being transferred. The process of FIG. 6 is similar in some respects to that of FIG. 5, with the difference that it does not utilize a voltage measurement of the accumulation capacitor. At a first step 6.1, initialization may be performed to place the charge transfer measurement circuitry and software in a desired state from which to start measuring. At step 6.2, a charge transfer cycle or a number of charge transfer cycles may be performed. At 6.3, a check may be done to determine whether a current counts value is equal to a predetermined value N. If it is not, the process may move to step 6.7, where another check may be performed to determine whether the total counts is within a target range. If not, the process may move to step 6.8 where the current counts value may be incremented, followed by a return to step 6.2. The loop formed by 6.2, 6.3, 6.7 and 6.8 may be repeated until the current counts value equals predetermined value N. This should lead to the check at 6.3 giving a positive answer with the process moving to step 6.4, where the current counts value may be reduced by a predetermined number of counts Z. Next, step 6.5 may be performed, where charge proportional to counts value Z may be removed from a storage or accumulation capacitor used for the charge transfer process. Similar to that discussed before, the charge removal step should retain any residual of charge which is smaller than packets or units of charge transferred during one charge transfer step or count. As step 6.6, a multiplier X may be incremented, followed by a return to step 6.2.

The total counts value used during the check in step 6.7 comprise the sum of the current counts value and the product of Z and multiplier X, where X represents the number of times that the current counts value has been reduced by a value equal to Z during execution of the loop formed by 6.2, 6.3, 6.4, 6.5 and 6.6. During a typical measurement, the process may execute loop 6.2-6.3-6.7-6.8 a number of times, followed by one iteration of loop 6.2-6.3-6.4-6.5-6.6, followed by loop 6.2-6.3-6.7-6.8 again executed a number of times, followed by another single iteration of loop 6.2-6.3-6.4-6.5-6.6 and so forth. This may be repeated until the total counts value moves into a desired target range, after which the process may move to step 6.9 where the current counts value is set equal to the sum of the currents counts and the product of multiplier X and predetermined value Z.

In some applications, the lack of an accumulation capacitor voltage measurement in the above process represented by FIG. 6 may be an advantage. Similarly, it may be possible to achieve a very high counts value without requiring a high-bit-value counter. This may be an advantage if a charge transfer measurement circuit is limited to lower bit values, for example eight- or sixteen-bit values.

Step 6.5 in FIG. 6 may be optionally left out. However, this may then limit the counts target range achievable, as the accumulation capacitor, or another storage element, will continue to charge up further after executing loop 6.2-6.3-6.4-6.5-6.6. The maximum voltage present in the charge transfer measurement circuit, or a value lower than this, may then limit the counts target range which can be achieved. For example, if N equals a thousand, and this results in a voltage of around 1V over an accumulation capacitor, any practical circuit may then be limited to only a few repetitions of loop 6.2-6.3-6.4-6.5-6.6.

Figure 7:
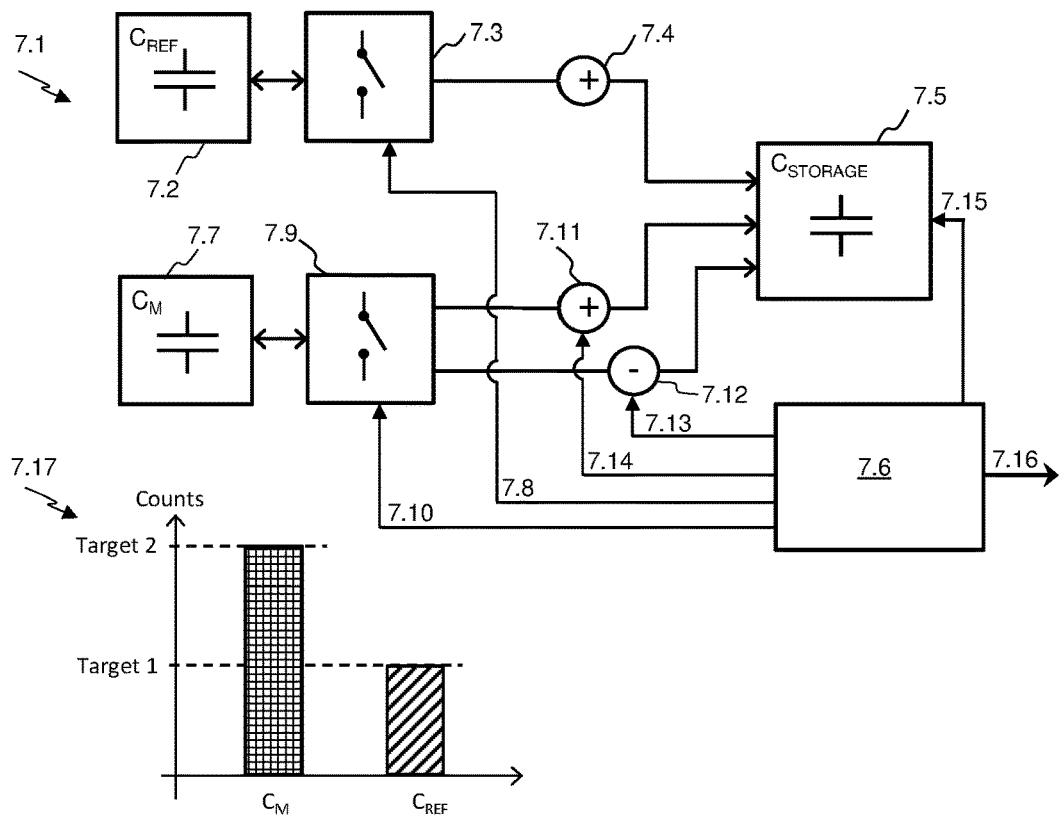
FIG. 7 shows a block diagram of an exemplary embodiment of a charge transfer measurement system that uses a reference storage element.

FIG. 7 presents another exemplary embodiment of the present invention in block diagram format at 7.1, wherein a reference capacitance 7.2 (Cref) may be used with PCC and/or other circuitry to reverse the sign of a change in charge transfer counts during capacitive sensing from that traditionally observed. Reference capacitor 7.2 may be connected to a switching-and-compensation block 7.3, wherein the latter may be under control of a measure-and-processing block 7.6 via line 7.8. Reference capacitor 7.2 and block 7.3 may be set-up to add charge to a storage element 7.5, for example a storage or accumulation capacitor, as indicated by summation symbol 7.4. Measure-and-processing block 7.6 may monitor or measure the voltage, or another parameter, of storage element 7.5, as indicated by line 7.15.

A sensor element 7.7, for example a measured or_sensor capacitor Cm, may be connected to a switching-and-compensation block 7.9, wherein the latter may also be under the control of measure-and-processing block 7.6 via line 7.10. According to the present invention, sensor element 7.7 and block 7.9 may be used to either add charge to storage element 7.5 or remove charge from storage element 7.5, as symbolized by 7.11 and 7.12 respectively. Whether charge from sensor element 7.7 is added or removed may be controlled by measure-and-processing block 7.6, as indicated by lines 7.14 and 7.13 respectively. Block 7.6 may output a measurement result, or another parameter, via line 7.16, which may be a wired or wireless connection.

The present invention teaches that the combination of reference capacitor 7.2 and switching-and-compensation block 7.3 may be initially setup and/or configured by block 7.6 such that a charge transfer process with these may result in a first target of counts, Target 1, being reached before the process trips, i.e. before the voltage on storage element 7.5 reaches a predetermined threshold or reference level due to charge transferred from said reference capacitor 7.2. For example, Target 1 may be a counts value of one-thousand. Further, sensor element 7.7 and switching-and-compensation block 7.9 may be initially setup and/or configured by block 7.6 such that a charge transfer process with these may result in a second target of counts, Target 2, being reached before the process trips, i.e. before the voltage on storage element 7.5 reaches a predetermined threshold or reference level due to charge transferred from sensor element 7.7. It should be noted that the addition of charge from sensor element 7.7 to storage element 7.5 implies that block 7.5 uses the charge transfer path which includes 7.11, and the charge transfer path which includes 7.13 is disabled or disconnected. Target 2 may be higher than Target 1. For example, Target 2 may be two-thousand counts. The bar graph presented at 7.17 in FIG. 7 illustrates the relative values of said first and second counts targets in a qualitative manner. In essence, the initial setup and/or configuration means that the packet of charge transferred during a particular charge transfer cycle from reference capacitor 7.2 to storage element 7.5 is larger than the packet transferred from sensor element 7.7, resulting in less counts before a trip event. The initial settings to achieve these counts targets may then be saved in the one or other memory.

The above-described initial setup may be followed by a charge transfer measurement phase that utilize said initial settings/configurations while performing some or all of the following steps. During each charge transfer cycle of said charge transfer measurement phase, charge from reference capacitor 7.2 may be added to storage element 7.5 while charge from sensor element 7.7 may be subtracted from said storage element. Due to the initial setup and/or configuration used, this should result in storage element 7.5 taking longer to reach a trip event than it would for only the reference capacitor 7.2, since the effective packet of charge added to storage element 7.5 is smaller due to subtraction of the charge via sensor capacitor 7.7. The present invention teaches that the counts result may be adjusted back to a desired range through the use of compensation circuitry or settings for example, PCC circuitry. For example, PCC may be used to add enough charge to said storage element 7.5 during each transfer cycle to achieve a nominal value of one-thousand counts as a result. In other words, PCC may be used when no touch or proximity event is occurring to negate the effect of charge subtraction via Cm 7.7 during every cycle, leaving only the charge added by Cref 7.2, which should result in one-thousand counts to the initial setup/configuration as described.

Hereafter, if a mutual-capacitance, also known as projected-capacitance or trans-capacitance, measurement is performed with the above-described initial settings and PCC setup, a proximity or touch event may result in a decrease in counts, contrary to the traditional increase in counts observed for proximity or touch events with mutual-capacitance sensors. Said decrease in counts may occur since a proximity or touch event may reduce the mutual-capacitance of sensor 7.7, leading to less charge subtracted from storage element 7.5 during each charge transfer cycle. Consequently, storage element 7.5 may fill up faster, resulting in a smaller counts value. In other words, during a proximity or touch event an engaging object may reduce the mutual-capacitance of sensor 7.7 by a certain delta. The end counts result should decrease by an amount directly proportional to this delta, as the amount of mutual-capacitance decrease directly influences the decrease in the amount of charge subtracted from storage element 7.5 during each transfer cycle.

Conversely, if a self-capacitance, also known as surface-capacitance or absolute-capacitance, measurement is performed with the above-described initial settings/configuration and PCC setup, a proximity or touch event may result in an increase in counts, contrary to the traditional decrease in counts observed for proximity or touch events with self-capacitance sensors. Said increase in counts may occur since a proximity or touch event may increase the self-capacitance of sensor 7.7, leading to more charge being subtracted from storage element during each charge transfer cycle. Consequently, storage element 7.5 may fill up slower, resulting in a larger counts value.

According to the present invention, it may be desirable to measure a decrease in counts for a proximity or touch event, irrespective of whether mutual-capacitance or self-capacitance sensing is performed. In other words, proximity and touch events causing a decrease in charge transfer counts, whether sensor element 7.7 is a mutual-capacitance sensor or a self-capacitance sensor may be desirable. This may be achieved in the following manner. For mutual-capacitance measurements, the above-described method and apparatus may be used, leading to a decrease in counts due to a proximity or touch event. However, for self-capacitance measurements, charge packets from both reference capacitor 7.2 and from sensor element 7.7 may be added to storage capacitor 7.5 during each transfer cycle. This may cause storage capacitor to fill up at a faster rate than what is obtained if only the reference capacitor or the self-capacitance sensor is used, resulting in a lower than ideal counts value, which may be rectified through the use of PCC methods and apparatus similar to what has been described before. That is, PCC methods and apparatus may, for example, be used to negate or offset the amount of charge added from said self-capacitance when no touch or proximity event occurs. Consequently, when a proximity or touch event does occur, charge transfer counts may decrease within a preferred range, given that the proximity or touch event should increase the self-capacitance of sensor 7.7 by a delta which is not compensated for, causing larger packets of charge to be added to storage element 7.5.

In the above manner, it may therefore be possible to realize a charge transfer measurement circuit and method which may report a decrease in counts for both a mutual-capacitance and a self-capacitance measurement.

It should be noted that the embodiment shown in FIG. 7 is purely exemplary, and should not be construed as limiting. For instance, it may be possible to use a single charge transfer path for transfers between the reference capacitor and storage capacitor and between the sensor capacitor and storage capacitor. Said single path may be selectively coupled to either the reference capacitor or the sensor capacitor in any manner necessary, for example it may be coupled using time-multiplexed access, or based on events. In addition, compensation, charge-addition, charge-subtraction and other circuitry may also be shared by both the reference capacitor charge transfer apparatus and methods and the sensor capacitor charge transfer apparatus and methods. In addition, objects which may engage said sensor capacitor to cause a proximity or touch event need not be limited to human appendages, but may include inanimate objects such as metal probes, conductive surfaces and so forth. Said storage capacitor may also be replaced with another integrating element without departing from the teaching of the present invention. For example, the amount of charge transferred to or removed/subtracted from said integrating element may be purely numerical values present in processing or logic circuits.

Figure 8:
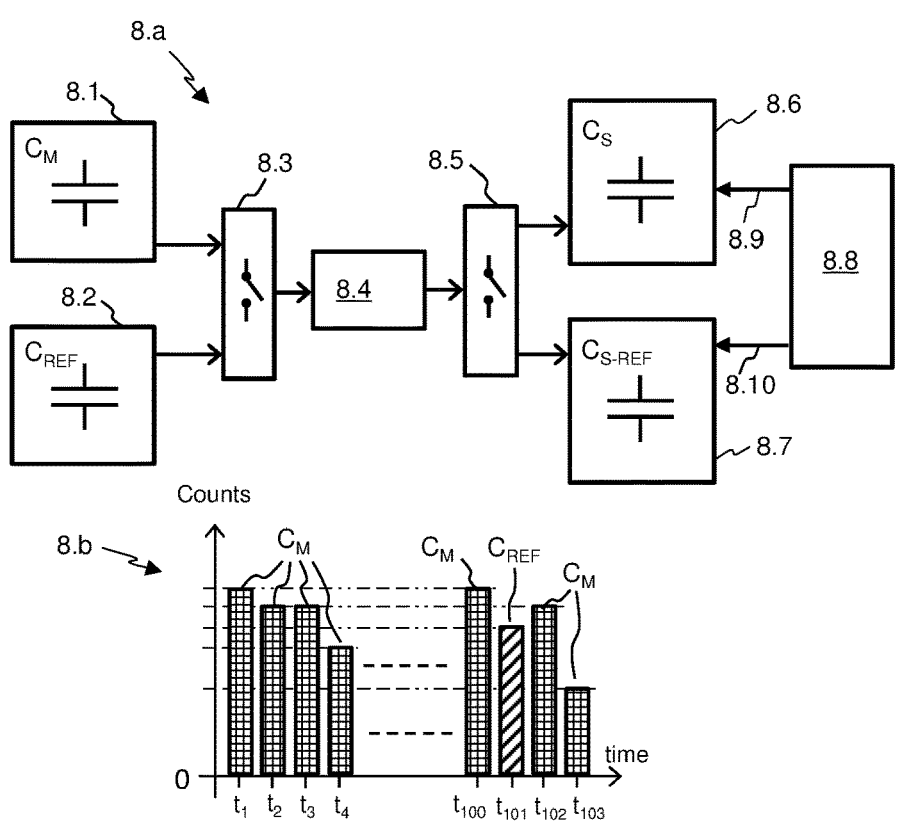
FIG. 8 shows a block diagram of an embodiment where a reference capacitor and a reference storage capacitor share a charge transfer channel with a sensor and storage capacitor.

FIG. 8 shows an exemplary embodiment of the invention in block diagram format where a charge transfer channel is shared between a sensor and an associated storage element on the one hand, and a reference sensor and an associated reference-storage element on the other hand. To elaborate, a sensor capacitor 8.1 is shown at 8.a, wherein the sensor capacitor may be connected to a first switching or multiplexing block 8.3. A reference capacitor 8.2, i.e., a capacitor whose value is not influenced by user interaction, may also be connected to said first switching or multiplexing block 8.3. A charge transfer channel 8.4 may be connected between the first switching and multiplexing block 8.3 and a second switching and multiplexing block 8.5. Channel 8.4 may comprise any circuitry use to transfer and process charge before storing it in a storage element such as an accumulation capacitor. For example, it may comprise compensation circuitry such as PCC circuitry, current mirror circuits, capacitor arrays and so forth. The second switching and multiplexing block 8.5 may be connected to the two distinct storage elements namely storage capacitor 8.6 and reference-storage capacitor 8.7. A processing-and-measuring circuit 8.8 may be connected to each of the storage capacitors via respective connections 8.9 and 8.10 as illustrated.

Exemplary operation of the embodiment depicted at 8.a will now be described. Sensor capacitor 8.1 may change in capacitance due to user interactions, or other events, causing less or more charge to be stored in it. During sensor measurement periods or timeslots, sensor capacitor 8.1 may be connected via the two switching blocks 8.3 and 8.5 and charge transfer channel 8.4 to storage capacitor 8.6 for the transfer of charge to said storage capacitor over a number of charge transfer periods or counts, as is known in the art. Reference capacitor 8.2 and reference storage capacitor 8.7 would typically not be connected to charge transfer channel 8.4 during the sensor measurement periods or timeslots. Processing-and-measuring circuit 8.8 may be used to monitor the voltage over storage capacitor 8.6. As is known, a user may interact with the sensor capacitor 8.1, which may cause a change in said counts obtained during sensor measurement periods. However, according to the present invention, reference channel measurement periods or timeslots using the dedicated reference storage capacitor 8.7 to store charge transferred from reference capacitor 8.2 via charge transfer channel 8.4 may be interleaved with said sensor measurement periods or timeslots.

This interleaving of reference charge transfer measurements with the reference capacitor 8.2 and reference storage capacitor 8.7 in-between sensor charge transfer measurements may be done in any required manner. For example, it may be performed according to a fifty percent time multiplexing basis, where each number of sensor measurement periods may be followed by exactly the same number of reference channel measurement periods. Typically, the sensor capacitor 8.1 and storage capacitor 8.6 would not be connected to charge transfer channel 8.4 during a reference channel measurement. In other words, the charge transfer channel 8.4 would only be used to transfer charge from reference capacitor 8.2 to the reference storage capacitor 8.7 during these reference channel measurements whereas the Cm will only be configured for charge transfer to the Cs during the period of measurement of the Cm.

Processing-and-measuring circuit 8.8 may monitor the voltage of reference storage capacitor 8.7 during the reference channel measurement periods, and may determine a reference channel counts value for the transfer of charge from reference capacitor 8.2 to reference storage capacitor 8.7. According to the present invention, since the nominal values of these two capacitors are known, a nominal reference channel counts value may be determined. If noise, temperature, or other factors cause a difference between a measured counts value for the reference channel and said nominal value, a high likelihood may exist that said noise, temperature or other factors also affect the sensor charge transfer measurements for capacitance 8.1, given that charge transfer channel 8.4 and switching or multiplexing blocks 8.3 and 8.5 are shared with reference channel measurements. The discrepancy between a measured reference channel counts and the expected or nominal reference channel counts value may be used to adjust counts values obtained during sensor measurement periods, and to compensate for the effects of noise, temperature, or other factors, according to the present invention. The changes in the reference measurements counts (or other parameter such as V level after a fixed number of transfers) may also be determined by long terms average values or other protocols. The key point is that these changes are not caused by user actions and therefore must be compensated for in the normal Cm measurements to correct for low frequency noise, temperature, radiated-noise, conducted-noise or other factors.

An exemplary interleaving of sensor measurement periods and reference channel measurement periods are shown at 8.b in FIG. 8. In this case, a hundred sensor measurement periods may elapse before a single reference channel measurement period occurs, as is evident from the counts values depicted at t1 to t101. This is purely exemplary, and the present invention should not be limited in this regard.

In another exemplary interleaved Cm and Cref measurement protocol, the measurement cycles may be performed as follows. One measurement of Cm may be executed until a trip is encountered (i.e. the Cs reached a Vtrip level after x number of transfers), and then a measurement with Cref into Cs-ref may be done. The information for both sets are accumulated as per the requirements of the extended measurement method proposed in this invention. Since the Cref channel is not influenced by the user, any shifts in counts (or other measured metrics such as Voltage after a fixed number of transfers) should be related to noise, temperature, other environmental or parameter that may also affect the Cm (UI electrode) and as such can be used to compensate for non-user related shifts.

In another embodiment the interleaved operation can be done at charge transfer level i.e. a single transfer between Cm and Cs and then a single transfer between Cref and Csref, to be repeated.

Figure 9:
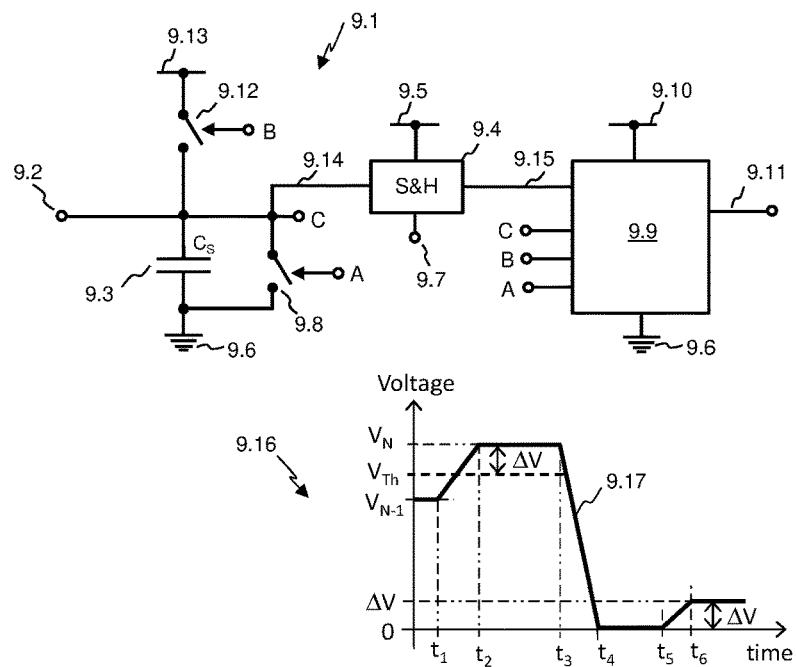
FIG. 9 depicts the use of a sample-and-hold circuit to determine the value of a residual voltage and restoring it in a storage capacitor.

FIG. 9 depicts an exemplary embodiment in the form of a charge transfer circuit at 9.1, where a sample-and-hold (S&H) circuit 9.4 may be used to acquire a residual voltage by which a storage capacitor 9.3 is charged above a predetermined trip voltage. The storage capacitor 9.3 may be charged during charge transfers from elements or members connected to terminal 9.2 until the voltage on capacitor 9.3 equals or exceeds a threshold or trip voltage. Due to quantization errors during said charge transfer, the voltage across storage capacitor 9.3 may exceed the threshold or trip voltage by a residual voltage $\Delta V$, as discussed before during the present disclosure. According to the present invention, S&H circuit 9.4 may be used to acquire said residual $\Delta V$ by, for example, setting its reference voltage at terminal 9.7 to said threshold or trip voltage, with S&H circuit 9.4 supplied via voltage bus 9.5. The acquired value of residual $\Delta V$ may be communicated to a processing-and-control circuit 9.9 via a connection 9.15. The processing-and-control circuit 9.9 may be supplied from a voltage bus 9.10 and have a connection to ground 9.6, as well as other connections 9.11, for example, communication connections. Hereafter, processing-and-control circuit 9.9 may discharge storage capacitor 9.3 completely, or substantially completely, via control signal A, causing switching element 9.8 to close and both terminals of storage capacitor 9.3 to be connected to ground 9.6. Another method and circuitry (not shown) to discharge storage capacitor 9.3 may be used alternatively. The processing-and-control circuit 9.9, or another circuit, may monitor the voltage across terminal C to determine when storage capacitor 9.3 is depleted of charge, or reaches a predetermined state of charge during said discharge. Naturally, the present invention is not limited to this, as would be appreciated by those skilled in the relevant arts, and switching element 9.8 may simply be closed for a sufficiently long period to ensure that storage capacitor 9.3 is discharged.

According to the present invention, after discharging, said residual $\Delta V$ may be loaded into the storage capacitor again. For example, after ascertaining that storage capacitor 9.3 has been depleted of charge, processing-and-control circuit 9.9 may reload residual $\Delta V$ into storage capacitor 9.3 by closing switching element 9.12 via control signal B, wherein switching element 9.12 may be located between a voltage bus 9.13 and terminal 9.2. Alternatively, S&H circuit 9.4 may be used in the one or other manner to reload the residual $\Delta V$ into storage capacitor 9.3. Or another technique and circuitry (not shown) may be used to reload said residual $\Delta V$ into the storage capacitor. What is paramount is that the storage capacitor is charged via charge transfers until a trip event occurs, followed by the acquisition of said residual voltage $\Delta V$ by the S&H circuit, followed by a discharge of the storage capacitor and lastly reloading the residual $\Delta V$ into the storage capacitor.

The above may be advantageous, since the residual $\Delta V$ may now be loaded into the storage capacitor with a ground reference. It may be used during repetitive charge transfer methods for increasing a counts value while maintaining and/or accumulating the residual voltage, as described elsewhere by the present disclosure.

Skilled art practitioners will appreciate that the three voltages busses 9.5, 9.10 and 9.13 need not be distinct, but may be one bus. Further, a typical, qualitative voltage versus time plot for the above-described circuitry and methods is presented at 9.16 in exemplary manner. Between t1 and t2, the voltage 9.17 of the storage capacitor traverses the trip level $V_{Th}$ by said residual $\Delta V$, for example due to an $N^{th}$ charge transfer cycle. Between t2 and t3, the S&H circuit may acquire the residual voltage. Between t3 and t4, the storage capacitor is discharged completely. Between t5 and t6, the residual $\Delta V$ is reloaded into the storage capacitor.

Figure 10:
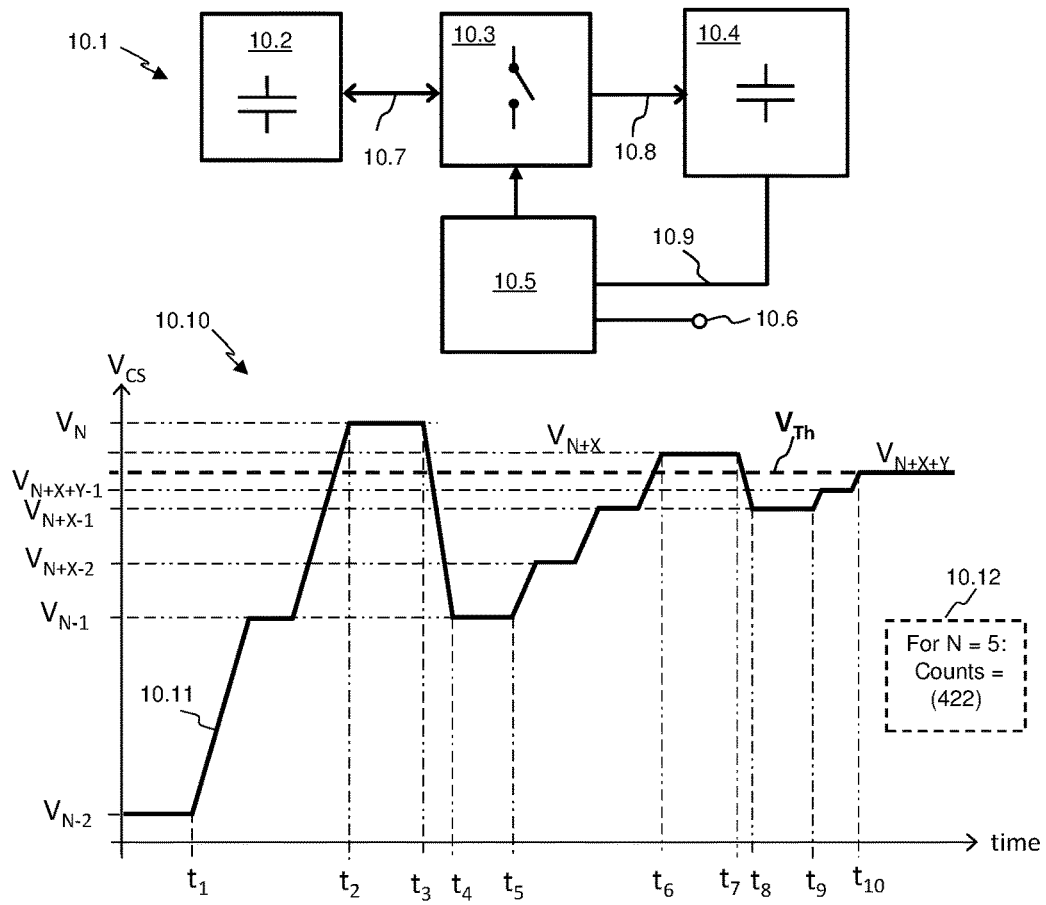
FIG. 10 shows an exemplary embodiment for increasing the resolution of a charge transfer measurement via the use of repetitive measurements with smaller packets of charge.

Yet another exemplary embodiment is depicted in FIG. 10 for increasing charge transfer measurement accuracy through the use of a plurality of sequential charge transfer measurement processes that use decreased charge packet sizes for each subsequent process and a single threshold voltage $V_{Th}$ with which to compare an accumulation capacitor voltage $V_{CS}$. A block diagram of a charge transfer circuit which may be used in such an embodiment is depicted at 10.1, and will be briefly described. A sensor element 10.2, for example a measured capacitor Cm, may be connected via 10.7 to a charge transfer block 10.3, wherein the latter may comprise any relevant circuitry to charge sensor 10.2 from an energy source, and to transfer charge from sensor 10.2 via 10.7 and 10.8 to an accumulation element 10.4, for example to an accumulation capacitor 10.4, also referred to as Cs. Charge transfer block 10.3 may, for example, comprise a plurality of transistors, current mirror circuits, diodes, capacitors, resistors and voltage and current sources, as is known in the art. A measurement and control block 10.5 may be used to control the operation of charge transfer block 10.3 as shown, and may measure or monitor the voltage of Cs 10.4 via a connection 10.9. For example, block 10.5 may comprise a comparator or comparator circuit to compare the voltage $V_{CS}$ of Cs 10.4 with a predetermined threshold $V_{Th}$. A result of said comparison, or another parameter or value, may be communicated by block 10.5 to other circuitry (not shown) via a connection 10.6, which may be wired or wireless.

The circuit depicted at 10.1, or another circuit (not shown), may be used to implement a plurality of sequential charge transfer (CT) measurement processes with different sizes of charge packets or quanta used by each of said plurality of processes, in order to determine a more accurate overall counts result. A qualitative graph 10.11 of $V_{CS}$ is presented at 10.10 in exemplary manner for such an implementation, and will now be described. A first CT measurement process of said plurality may utilize a first charge packet size to transfer charge from Cm to Cs repetitively. After N−2 repetitions at time t1, voltage $V_{CS}$ may be at a value of $V_{N-2}$ as depicted. Two further charge transfer with said first packet size may result in $V_{CS}$ exceeding the threshold voltage $V_{Th}$ at time t2 and achieving a value of $V_N$ to cause a trip event, for example to cause a comparator to trip. According to the invention, a value of N−1 may be recorded as result for the first CT measurement process and as a first, most significant digit of an overall counts result. Subsequently, charge equal or proportional to one count of said first CT measurement process may be removed from Cs, as shown between t3 and t4, resulting in $V_{CS}$ decreasing to a value of $V_{N-1}$ as shown, and said trip event being cleared. Next, a second CT measurement process, which utilize a second, smaller charge packet size, may be performed. For example, the second charge packet size may be ten times smaller than said first charge packet size. During the second CT measurement process, Cs may again be filled, with $V_{CS}$ increasing from $V_{N-1}$ at t5 until it exceeds threshold $V_{Th}$ again at t6 after X number of transfers. In the example depicted, X is equal to three. Subsequently, charge equal or proportional to one count of the second CT measurement process may be removed from Cs, as shown between t7 and t8, with $V_{CS}$ decreasing to a level of $V_{N+X-1}$ as shown. A value of X-1, or two for the example depicted, may be recorded as result for the second CT measurement process, and as a second digit of an overall counts result. Next, a third CT measurement process, which utilize a third, still smaller charge packet size, may be performed. For example, the third charge packet size may be ten times smaller than said second packet size and one-hundred time smaller than said first packet size. During the third CT measurement process, Cs may again be filled, with $V_{CS}$ increasing from $V_{N+X-1}$ to $V_{Th}$ as shown, using two transfers of said third size charge packets. This may conclude the exemplary overall measurement process, with a value of two recorded as result of the third CT measurement process, and as a third, least significant digit of an overall counts result. As shown at 10.12, if N is equal to five, the overall counts result may be 422. In this manner, a charge transfer measurement may be performed with higher accuracy. The preceding is merely presented as an example, and should not be construed as limiting. For example, the counts value may be inverted in the one or other manner.

The present invention should not be limited to the exemplary embodiment depicted in FIG. 10. For example, in a related embodiment, as discussed during the Summary of the present disclosure, a type of Sigma-Delta Analog-to-Digital Converter (ADC) may be implemented. This may be achieved by keeping the amount of charge removed between t3 and t4 and between t7 and t8 the same, and by using the same size of charge packets for each of the charge transfer measurement processes up to a trip event. To elaborate, a first charge transfer measurement process may cause the voltage of Cs to exceed a specific threshold, causing a first trip event and a bit value of one in a bit stream of binary values that represent the overall output. Subsequently, a specific amount of charge may be removed from the Cs to cause the trip event to clear, and a value of zero of said bit stream. A second charge transfer measurement process may then commence, using the same, or similar, sized packets of charge to transfer charge from a sensor to the Cs, causing an increase the voltage of Cs. While the voltage of Cs remains below said threshold, the value of zero in said binary stream may be maintained. When sufficient charge has been transferred during said second charge measurement process, another trip event may occur, causing another value of one in said binary bit stream. This may be followed by another removal of said specific amount of charge from Cs, causing the trip event to clear, and a zero value in the bitstream. Next, a third charge transfer measurement process may commence, again causing a trip event and the resulting bit stream value of one, a subsequent clearing of the trip through charge removal and so forth. In other words, the present invention teaches that repetitive charge transfer measurement processes, each with a trip event and a subsequent clearing through charge removal, may be used to realize a type of Sigma-Delta ADC where a binary bit stream is generated as result, and where the occurrence of binary ones in said stream may represent or indicate the one or other sensor parameter or a change in said parameter.

Herein, "or" is used to convey inclusive and not exclusive, unless expressly indicated otherwise or indicated otherwise by context. Therefore, herein, "A or B" may mean "A, B, or both," unless expressly indicated otherwise or indicated otherwise by context. In addition, "and" is used to convey both joint and several, unless expressly indicated otherwise or indicated otherwise by context. Therefore, "A and B" may mean "A and B, jointly or severally," unless expressly indicated otherwise or indicated otherwise by context.

The invention claimed is:

1. A measurement circuit that repetitively transfers charge from a sensor to a storage element for measuring a change in a parameter of the sensor, said circuit characterised by a binary stream produced as output, wherein a binary one is produced in said stream every time a voltage of said storage element exceeds a threshold due to said transfers to cause a comparator to trip, a binary zero is produced in said stream when the storage element voltage is below said threshold and wherein the circuit removes a predetermined amount of charge from the storage element after each comparator trip to cause the storage element voltage to reduce by a predetermined minimum amount below said threshold.

2. The circuit of claim 1, wherein said sensor is a capacitive sensor.

3. The circuit of claim 1, wherein said sensor is a magnetic field sensor.

4. The circuit of claim 3, wherein said sensor is a Hall effect sensor.

5. The circuit of claim 1, wherein said sensor is an inductive sensor.

6. The circuit of claim 1, wherein said sensor is an optical sensor.

7. The circuit of claim 1, wherein said storage element comprises an accumulation capacitor.

8. The circuit of claim 7, wherein the predetermined amount of charge is removed through the use of current mirror circuits.

9. The circuit of claim 1, wherein said predetermined amount of charge is adjustable.

10. The circuit of claim 9, wherein adjustment is made with PCC and/or current mirror circuits.

11. A method for measuring a change in a sensor parameter, wherein charge is transferred from said sensor to a storage element, and wherein the method entails the following steps:
  repetitively transfer charge from the sensor to said storage element until a voltage of the storage element exceeds a threshold to cause a comparator to trip;
  produce a binary one value in a binary output stream to signify each occurrence of a comparator trip;
  produce a binary zero in the binary output stream to signify when said voltage is below the threshold;
  remove a predetermined amount of charge from the storage element after each trip to cause said voltage to reduce below the threshold by a predetermined minimum.

12. The method of claim 11, wherein said sensor is a capacitive sensor.

13. The method of claim 11, wherein said sensor is a magnetic field sensor.

14. The method of claim 13, wherein said sensor is a Hall effect sensor.

15. The method of claim 11, wherein said sensor is an inductive sensor.

16. The method of claim 11, wherein said sensor is an optical sensor.

17. The method of claim 11, wherein said storage element comprise an accumulation capacitor.

18. The method of claim 17, wherein the predetermined amount of charge is removed through the use of current mirror circuits.

19. The method of claim 11, wherein said predetermined amount of charge is adjustable.

20. The method of claim 19, wherein said adjustment is made with PCC and/or current mirror circuits.

* * * * *